US005375093A

United States Patent [19]
Hirano

[11] Patent Number: 5,375,093
[45] Date of Patent: Dec. 20, 1994

[54] TEMPERATURE DETECTING CIRCUIT AND DYNAMIC RANDOM ACCESS MEMORY DEVICE

[75] Inventor: Hiroshige Hirano, Nara, Japan

[73] Assignee: Matsushita Electric Industrial Co., Ltd., Osaka, Japan

[21] Appl. No.: 7,090

[22] Filed: Jan. 21, 1993

[30] Foreign Application Priority Data

Jan. 21, 1992 [JP] Japan .................................. 4-8329

[51] Int. Cl.[5] ................................................ G11C 7/00
[52] U.S. Cl. .................... 365/222; 365/212; 365/194; 327/512
[58] Field of Search ............... 365/211, 212, 222, 194; 307/310; 257/467

[56] References Cited

U.S. PATENT DOCUMENTS

| | | | |
|---|---|---|---|
| 4,453,237 | 6/1984 | Reese et al. | 365/222 |
| 4,547,867 | 10/1985 | Reese et al. | 365/212 X |
| 4,716,551 | 12/1987 | Inagaki | 365/222 |
| 4,883,992 | 11/1989 | Koglin et al. | 307/310 X |

Primary Examiner—Joseph A. Popek
Attorney, Agent, or Firm—Rogers & Wells

[57] ABSTRACT

Delay circuit 11 is composed of eight-stage NOT circuits. Polysilicon resistors RPS11 and RPS12 are connected to the sources of P channel type MOS transistor Qp12 and N channel type MOS transistor Qn12 in the second stage NOT circuit. These polysilicon resistors exhibit a smaller temperature dependency, as shown by dot lines in FIG. 2. The delay time of the eight-stage NOT circuits as a whole shows a smaller temperature dependency. Delay circuit 12 in FIG. 1 is composed of three-stage NOT circuit, followed by three-stage NOT circuit or one-stage NOT circuit. With such arrangement, a temperature detection circuit with no or less manufacturing deviations is completed. By utilization of this circuit, the refresh interval of self-refresh operation of a DRAM at low temperature may be expanded to be a multiple integer longer than a given reference interval to assure self-refresh operation at the optimum refresh interval within a wide range of temperature, and power consumption of the DRAM may be reduced at low temperature.

17 Claims, 35 Drawing Sheets

TEMPERATURE DETECTING CIRCUIT AND DYNAMIC RANDOM ACCESS MEMORY DEVICE

BACKGROUND OF THE INVENTION

1. Field of the Invention

This invention relates to a temperature detecting circuit and a dynamic random access memory device.

2. Description of the Prior Art

A dynamic random access memory (hereinafter called "DRAM") stores data by storing an electric charge in a memory cell capacitor. As time passes by, the electric charge stored in that capacitor leaks through a substrate or the like, making it impossible to store the data. It is, therefore, necessary to carry out a refresh operation, that is, rewrite the data every passage of a given period of time.

Generally, the refresh operation is achieved by applying an external control signal. The refresh operation which is achieved by an internal control signal generated inside the memory is called "self-refresh function."

With the recent expansion of applications of DRAMs, the demand is on increase for DRAMs for use with apparatus or equipment with battery-backup function. Thus, it is desired that DRAMs have the self-refresh function with a minimum of power consumption during the self-refresh function. As a typical example of a conventional DRAMs with the self-refresh function, a prior art DRAM as illustrated in Electronic Information and Communication Society, Technical and Research Report, Vol. 91, No. 64, (SDM91-10-22), pp. 51-57, is described with reference to FIG. 31 showing a circuit concept diagram and FIG. 32 showing a signal waveform diagram.

The operation of the DRAM is described briefly as follows.

A precharge signal OP precharges dummy memory cells of 1k bits. When this happens, $\phi E$ assumes logic level "H" to enable a timer which generates time T1. Refresh operation is carried out a predetermined number of refresh times (NCYC) during the period of T1. Thereafter, the signals $\phi P$, $\phi E$ are reset to logic level "L." Once the signals have been reset, the charge at node VN of the dummy memory cell will start leaking. When the voltage at node VN reaches a reference level VREF, $\phi E$ and $\phi P$ assume logic level "H" again. Then, the above mode of operation is repeated. The period of time where leaking is seen at node VN is called "self-refresh interval." However, this sort of self-refresh function of DRAMs experiences prolongation of the self-refresh interval when temperature becomes lower.

Consumption current I of DRAMs during refresh may be represented below where IAC is consumption current under enabled condition and IDC is one under standby (not-enabled) condition:

$$I = IAC/T + IDC$$

The consumption current I during refresh decreases as the refresh interval T becomes longer.

The conventional DRAMs with the self-refresh function utilizes the temperature dependency of the leak speed of the charges stored in the dummy memory cells of 1K bits in order to reduce the consumption current at low temperatures to a minimum by extending the self-refresh interval with low temperatures.

FIG. 33 illustrates the relationship of the self-refresh interval during the self-refresh function and the data hold time of DRAMs in regard to temperature. The data hold time of memory cells of DRAMs is determined by that of the memory cell which assumes the shortest data hold time, out of a number of the memory cells. When temperature increases, the data hold time of some of the memory cells becomes very short. In some instances, the temperature dependency of the data hold time is therefore larger than that of the self-refresh interval, as seen in FIG. 33.

Japanese Patent Laid-open 3-207084 discloses a dynamic random access memory device having a refresh interval which is variable with the ambient temperature. This device is described with reference to FIG. 34. Resistor R1 and variable resistor VR1 are connected in series between power supply voltage VCC and a ground level. Similarly, resistors R2, R3, R4 are connected between the power supply voltage and ground level. A signal at the junction of the resistors R2, R3 is supplied to two comparators 1, 2. A signal at the junction of the resistors R2, R3 is supplied to the comparator 1 via node N1, whereas a signal at the junction of the resistors R3, R4 is supplied to the comparator 2 via node N2. Outputs of the comparators 1, 2 are represented as S1, S2. A detector 3 is suggested which uses the output S1 as 60° C. detection signal and the output S2 as 40° C. detection signal.

As depicted in FIG. 33, the conventional self-refresh DRAMs experience the temperature dependency of the self-refresh interval which would be greater than that of the data hold time. In FIG. 33, the self-refresh interval becomes longer than the data hold time at temperatures above 75° C., causing a problem of failure to refresh.

Another problem is that the cell self-refresh interval might vary substantially due to deviations in the manufacturing process, because the cell refresh interval is determined by the leak speed of charges stored in cell capacitors.

In addition, the conventional DRAMs as in Japanese Patent Laid-open 3-207084 requires manufacturing of the resistors of different resistances R2≠R3≠R4(=R1) for detection of 40° C. and 60° C. To make different resistances, high precision manufacturing technique is required for different shapes of the resistors. To this end, a resistance compensation circuit is usually used to compensate the resistances of the resistors R2, R3 and the temperature variable resistor VR1. Two reference potentials are generated for nodes N1, N2 with the use of a reference potential generator of the resistors R1, R2, R3 and then supplied to the comparators 1, 2. Therefore, the reference potential generator may not be used for comparators where a reference potential varies with currents flowing nodes N1, N2.

SUMMARY OF THE INVENTION

With the above discussed problems in mind, an object of the present invention is to provide a temperature detecting circuit which suffers no or little deviations in the manufacturing process.

Another object of the present invention is to provide a DRAM which may maintain a refresh interval a multiple integer longer than a reference refresh interval during self-refresh function at low temperatures and carry out refresh function at an optimum refresh interval within a wide range of temperature and reduce power consumption to a minimum at low temperatures.

Still another object of the present invention is to provide a DRAM which may reduce power consumption to a great extent by having a no-refresh interval during "CBR" (CAS Before RAS: where CAS is Colum Address Strobe and RAS is Row Address Strobe) refresh mode at low temperatures.

Another object of the present invention is to provide a DRAM which is easy to inspect at respective device temperatures by utilizing its device temperature enhancing function.

To achieve the above mentioned objects, an aspect of the present invention provides a temperature detecting circuit which comprises a first delay circuit including a plurality of NOT circuits and having a delay time, said first delay circuit providing a first output signal, and a second delay circuit including a plurality of NOT circuits and having a delay time, said second delay circuit providing a second output signal, the temperature dependency of said delay time of the first delay circuit being greater than that of the second delay circuit, wherein the order of the first and second output signals is used as temperature detection.

To achieve the above mentioned objects, another aspect of the present invention also provides a temperature detecting circuit which comprises a first delay circuit including a plurality of NOT circuits and having a delay time, said first delay circuit providing a first output signal, and a second delay circuit including a plurality of NOT circuits and having a delay time, said second delay circuit providing a second output signal, the temperature dependency of said delay time of the first delay circuit being greater than that of the second delay circuit, wherein the order of the first and second output signals is used as temperature detection, and wherein a capacitor load is connected to an output node of the NOT circuits in the first delay circuit via a resistor having a largely temperature dependent resistance.

To achieve the above mentioned objects, still another aspect of the present invention provides a temperature detecting circuit which comprises a common power supply voltage terminal, a ground potential terminal, first and second resistors connected in series between the power supply voltage terminal and the ground potential terminal, and third and fourth resistors connected in series between the power supply voltage terminal and the ground potential terminal, the first and fourth resistors being made of same material and the second and third resistors being made of same material, wherein a potential is detected between the junction of the first and second resistors and the junction of the third and fourth resistors.

To achieve the above mentioned objects, another aspect of the present invention provides a temperature detecting circuit which comprises a common power supply voltage terminal, a ground potential terminal, first and second resistors connected in series between the power supply voltage terminal and the ground potential terminal, and third and fourth resistors connected in series between the power supply voltage terminal and the ground potential terminal, the first and third resistors being made of same material and the second and fourth resistors being made of different materials, wherein a potential is detected between the junction of the first and second resistors and the junction of the third and fourth resistors.

To achieve the above mentioned objects, another aspect of the present invention provides a dynamic random access memory device which comprises a temperature detecting circuit and a self-refresh function circuit, said temperature detecting circuit comprising a common power supply voltage terminal, a ground potential terminal, first, second, third and fourth resistors connected in series between the power supply voltage terminal and the ground potential terminal, the first and third resistors being made of same material and the second and fourth resistors being made of different materials, wherein a potential is detected as a temperature detecting signal between the junction of the first and second resistors and the junction of the third and fourth resistors, and wherein said self-refresh function circuit has the function of extending a refresh interval of the self-refresh function at low temperature, in response to the temperature detecting signal from said temperature detecting circuit.

To achieve the above mentioned objects, still another aspect of the present invention provides a dynamic random access memory device which comprises a temperature detecting circuit and a CBR refresh function circuit, said temperature detecting circuit comprising a common power supply voltage terminal, a ground potential terminal, first, second, third and fourth resistors connected in series between the power supply voltage terminal and the ground potential terminal, the first and third resistors being made of same material and the second and fourth resistors being made of different materials, wherein a potential is detected as a temperature detecting signal between the junction of the first and second resistors and the junction of the third and fourth resistors, and wherein the CBR refresh function of said CBR refresh function circuit at low temperature has an interval where no refresh is carried out, in response to the temperature detecting signal from said temperature detecting circuit.

According to the present invention, a DRAM with a temperature detecting circuit experiences no or little deviation in the manufacturing process of the temperature detecting circuit. By utilizing this circuit, it becomes possible to maintain a refresh interval a multiple integer longer than a reference refresh interval during self-refresh mode at low temperature. It also become possible to carry out refresh function at an optimum refresh interval within a wide range of temperature and reduce power consumption to a minimum at low temperatures.

Moreover, it becomes possible to reduce power consumption to a large extent, by having a no-refresh interval during CBR (CAS Before RAS) refresh mode at low temperatures.

DRAM devices are easy to inspect at respective device temperatures thanks to the temperature enhancing function thereof.

Additional features of the present invention are described in relation to the description of the preferred embodiments of the present invention.

DESCRIPTION OF THE PREFERRED EMBODIMENTS

Referring to FIGS. 1 to 4, a temperature detecting circuit according to a first embodiment of the present invention will be described in detail. The temperature detecting circuit detects the order of two output signals, one from a delay circuit having a delay time of a large temperature dependency and the other from another delay circuit having a delay time of a small temperature dependency, for the purposes of temperature detection.

Figure 1:
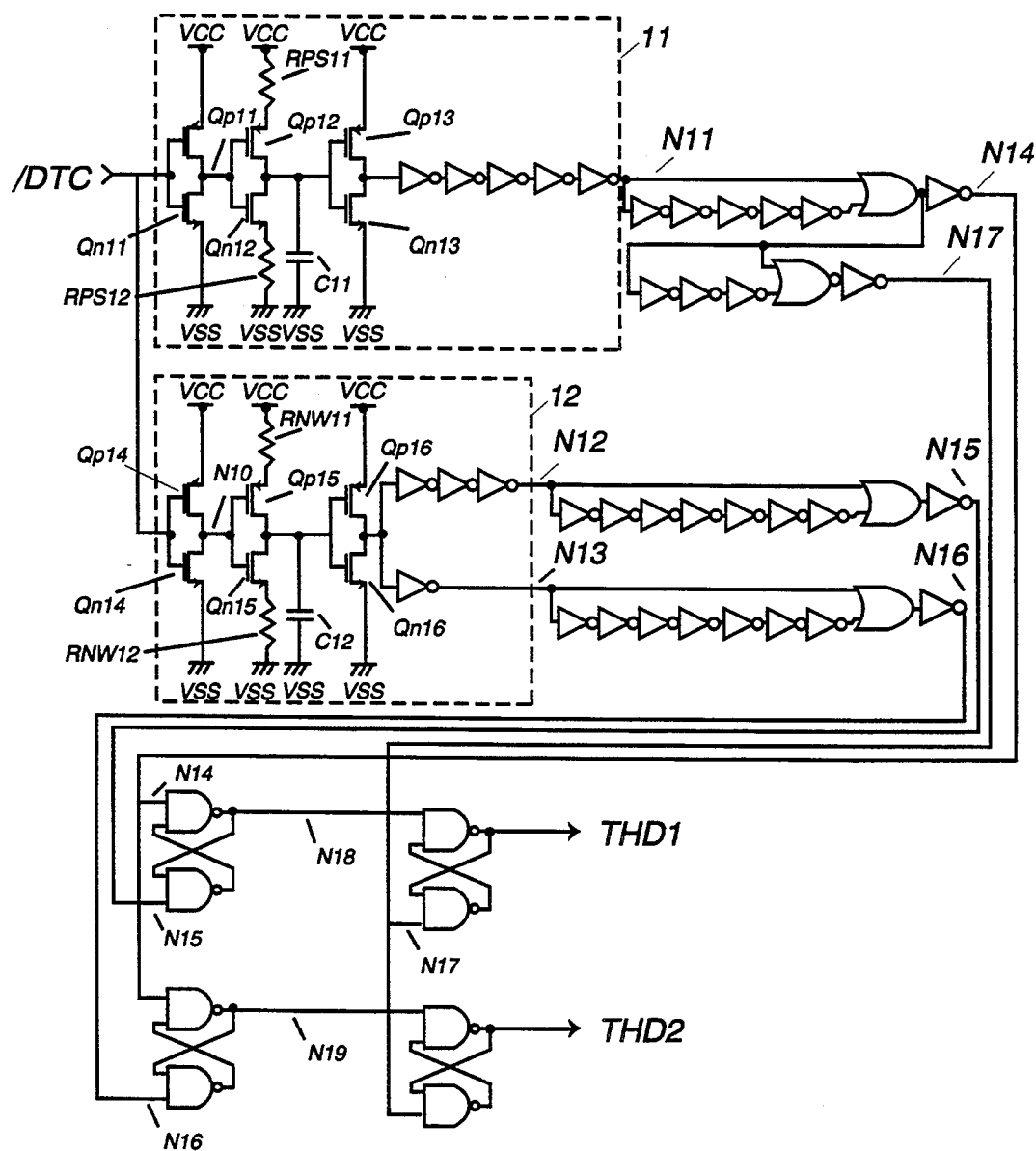
FIG. 1 is a circuit diagram of a temperature detecting circuit according to a first embodiment of the present invention.
Figure 2:
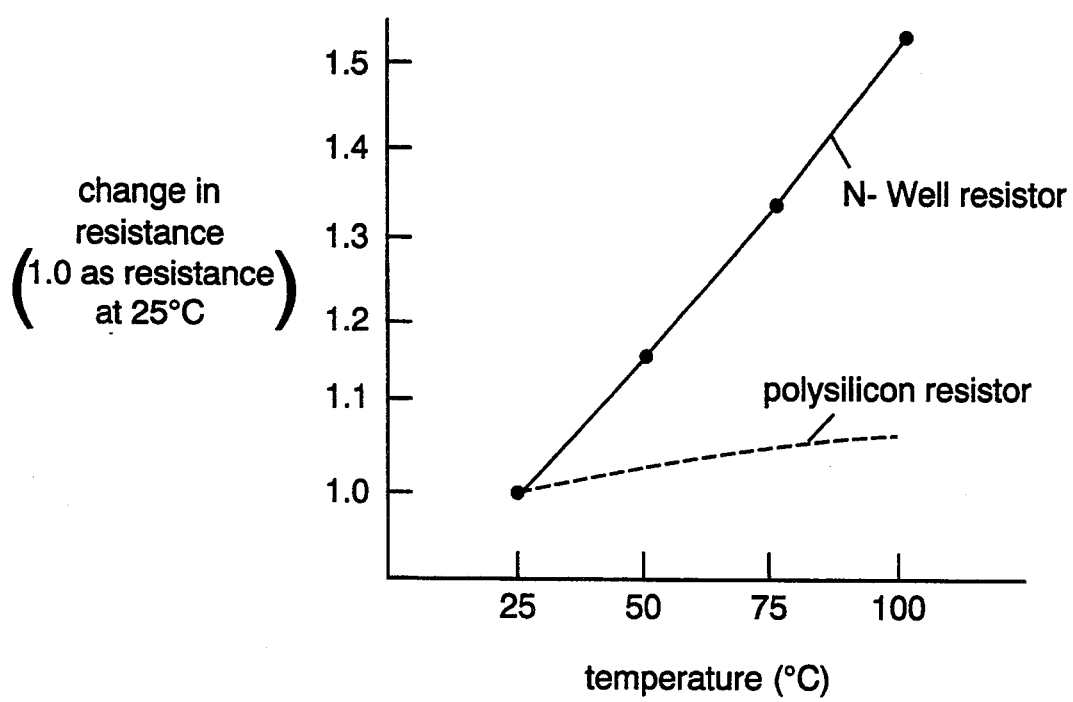
FIG. 2 is a graph showing the temperature dependencies of N-Well resistors and polysilicon resistors.
Figure 3:
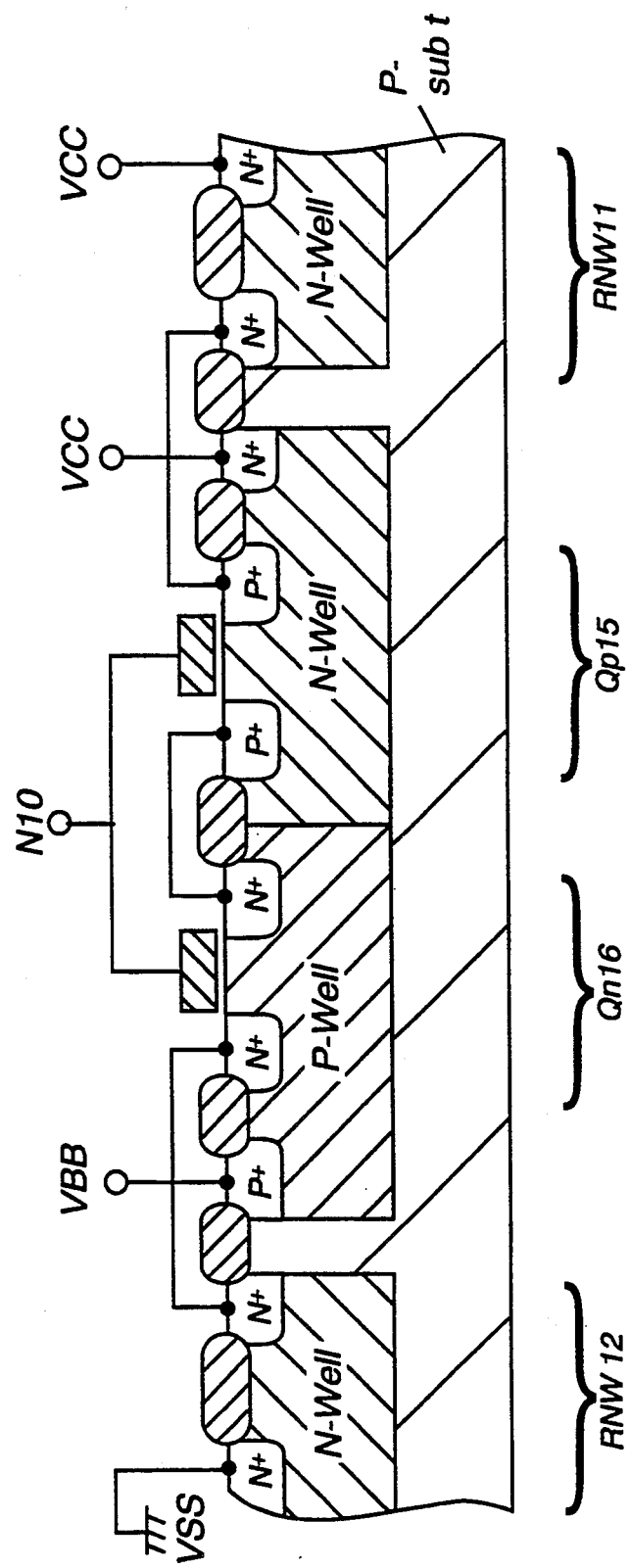
FIG. 3 is a cross sectional view of NOT circuits using N-Well resistors.
Figure 4:
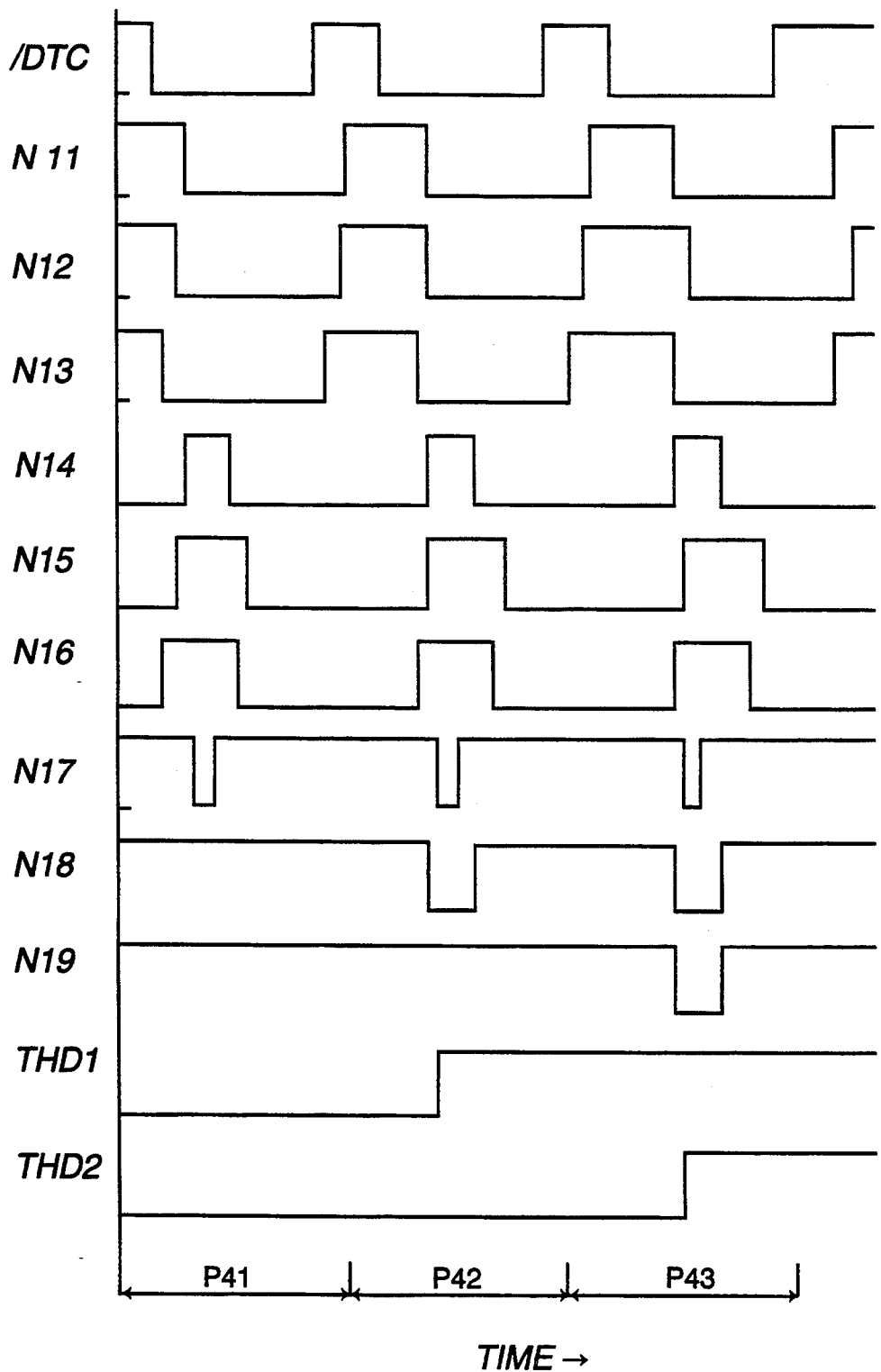
FIG. 4 is a signal waveform diagram of the temperature detecting circuit according to the first embodiment of the present invention.

FIG. 1 is a circuit diagram of the temperature detecting circuit according to the first embodiment of the present invention. FIG. 2 illustrates temperature dependencies of N type Well ("N-Well" hereinafter) resistors and polysilicon resistors both used in the circuit of FIG. 1. FIG. 3 is a cross sectional view of semiconductor elements in NOT circuits which include the N-Well resistors in the circuit of FIG. 1. FIG. 4 is a waveform diagram of the circuit of FIG. 1.

There are illustrated delay circuits 11, 12, P channel type MOS transistors Qp11–Qp16, N channel type MOS transistors Qn11–16, capacitors C11–C12, polysilicon resistors RPS11–RPS12, N-Well resistors RNW11–RNW12, power supply voltage VCC, ground voltage VSS, and substrate voltage VBB. Signals are designated as /DTC, THD1, THD2, N10–N19, with intervals of time designated as P41–P43.

The first delay circuit 11 of FIG. 1 is implemented with eight stages of NOT circuits. The second-stage NOT circuit comprises P channel type MOS transistor Qp12, N channel type MOS transistor Qn12, polysilicon resistor RPS11 connected to the source of Qp12 and another polysilicon resistor RPS12 connected to the source of Qn12. The resistance of the polysilicon resistors RPS11, RPS12, as illustrated by dot lines in FIG. 2, has a smaller temperature dependency.

FIG. 2 illustrates temperature dependencies of the resistances of the polysilicon resistors and the N-Well resistors used in the temperature detecting circuit. As is seen in FIG. 2, the polysilicon resistors exhibit such a smaller temperature dependency that the resistance thereof is only 1.06 times higher even when temperature changes from 25° C. to 100° C., whereas the N-Well resistors show a larger temperature dependency so that the resistance thereof becomes 1.54 times higher when temperature changes from 25° C. to 100° C. The dopant concentration of the polysilicon resistors is on the order of $1 \times 10^{20}$ cm$^{-3}$, and that of the N-Well resistors on the order of $1 \times 10^{16}$ cm$^{-3}$. For this reason, the delay time of the first delay circuit 11 comprising the eight-stage NOT circuits exhibits a smaller temperature dependency.

On the other hand, the second delay circuit 12 of FIG. 1 includes three stages of NOT circuits, followed by three stages of NOT circuits and a one stage of NOT circuit in parallel to each other. The second stage of the NOT circuits is implemented with the P channel type MOS transistor Qp15, N channel type MOS transistor Qn15, the N-Well resistor RNW11 connected to the source of Qp15 and the N-Well resistor RNW12 connected to the source of Qn15.

As is shown by the solid line in FIG. 2, the N-Well resistors RNW11, RNW12 exhibit a larger temperature dependency. For this reason, the delay time of the second delay circuit, including the three-stage NOT circuits and the following three-stage NOT circuit as well as the parallel one-stage NOT circuit, exhibits a larger temperature dependency. As the resistance of the N-Well resistors RNW11, RNW12 increases, the time necessary to charge to or discharge from capacitor C12 a charge would increase, with the results in extended delay time.

FIG. 3 illustrates a cross sectional view of semiconductor elements which constitute two-stage NOT circuits including the P channel type MOS transistor Qp15, the N channel type MOS transistor Qn15, and the N-Well resistors RNW11, RNW12.

Reverting to FIG. 1, temperature detection control signal/DTC is fed to the delay circuits 11, 12 which in turn supplies output signals N11–N13. Temperature detection signal THD1 is representative of the delay relationship between the signals N11 and N12, whereas temperature detection signal THD2 is representative of that between the signals N11 and N13.

The signals N14, N17 are pulse signals generated from the signal N11, the signal N15 from the signal N12, and the signal N16 from the signal 13. The temperature detection signals THD1, THD2 are developed from flip-flop circuits which receive these signals N14–N17.

As is obvious from FIG. 4 showing a waveform diagram, the signals N11–N13 are developed in the time sequential order of N13, N12 and N11 during the interval P41 of time where temperature is below 40° C. Under this situation, temperature detection signal THD1 assumes logic level "L" and temperature detection signal THD2 assumes logic level "L."

During the period P42 of time where temperature is between 40° C. and 60° C., however, the signals N11–N13 are developed in the order of N13, N11 and N12. Under this situation, temperature detection signal THD1 assumes logic level "H" but temperature detection signal THD2 assumes logic level "L."

Eventually, during the period P43 where temperature is above 60° C., the signals N11–13 appear in the order of N11, N13 and N12, with temperature detection signal THD1 of logic level "H" and temperature detection signal THD2 of logic level "H."

In this manner, the temperature detection signal senses three different ranges of temperature with boundaries 40° C. and 60° C., by utilizing the two temperature detection signals THD1, THD2.

One feature of this temperature detection circuit is that it is implemented with the polysilicon resistors and the N-Well resistors, that is, materials suffering from no or less manufacturing deviations, thereby assuring stable operation of the semiconductor elements. The dopant concentration of the polysilicon resistors is as high as $1 \times 10^{20}$ cm$^{-3}$. The temperature dependency of the resistance thereof is very small because the mobility of electrons is dependent upon this dopant concentration. The dopant concentration of the N-Well resistors, on the other hand, is as low as $1 \times 10^{16}$ cm$^{-3}$. In the latter case, the mobility of electrons not only depends upon the dopant concentration but also suffers from the impact of grid vibrations. Therefore, the temperature dependency of the N-Well resistors is larger. Deviations of the temperature dependency of these resistances are so small as to be negligible as compared with those resulting from varying dopant concentrations when injecting the dopants. The resistance of the polysilicon resistors varies within ±10% due to the difference in the thickness thereof, and that of the N-Well resistors varies within ±10% due to the difference in ion implantation. In the illustrated embodiment, the deviations in the resistance may be compensated for by breaking a fuse.

Because the temperature detection signals THD1, THD2 are derived as digital signals, it is much easier to apply the present temperature detection circuit to digital signal processing devices such as DRAMs and microprocessors.

Figure 5:
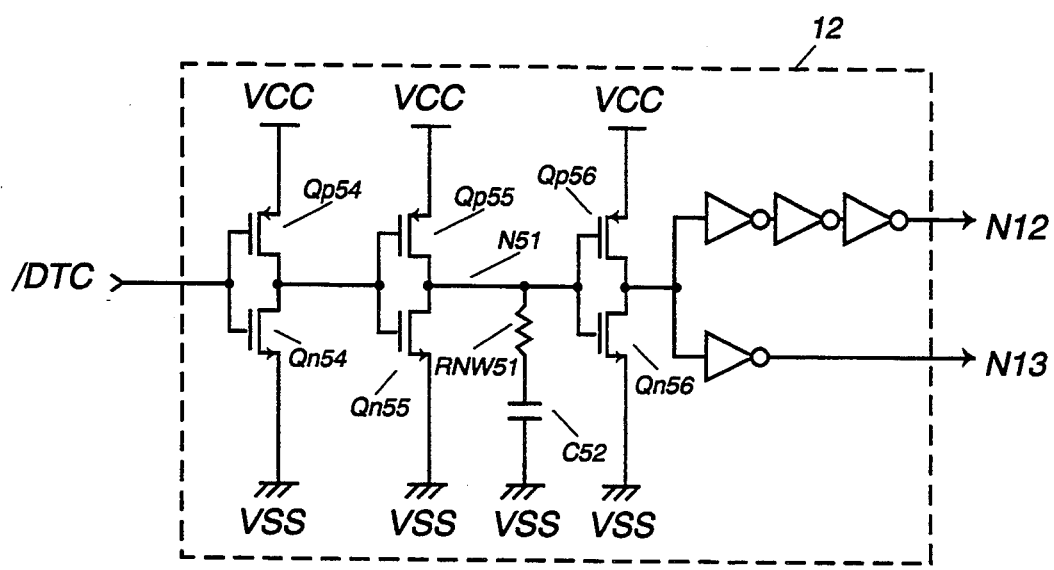
FIG. 5 is a circuit diagram of a temperature detecting circuit according to a second embodiment of the present invention.

Referring now to FIG. 5, there is described a temperature detection circuit according to a second embodiment of the present invention. Like the first embodiment, the temperature detection circuit of the second utilizes the temperature dependency of the delay time of the delay circuits. In this drawing, there is shown a circuit diagram of the second delay circuit 12 whose delay time has a larger temperature dependency.

There are illustrated P channel type MOS transistors Qp54–Qp56, N channel type MOS transistors Qn54–Qn56, capacitor C52, N-Well resistor RNW51, power supply voltage VCC, ground voltage VSS. Signals are designated N12–N51.

Delay circuit 12 is composed of three-stage NOT circuit, followed by three-stage NOT circuit and parallel one-stage NOT circuit. The capacitor C52 is connected to the drains of the P channel type MOS transistor Qp55 and N channel type MOS transistor Qn55 in the second stage NOT circuit via the N-Well resistor RNW51.

The N-Well resistor RNW51 exhibits a larger temperature dependency as with the first embodiment. The difference of this embodiment over the first embodiment lies in that the charge of the signal N51 may be accumulated on or discharged from the capacitor C51 immediately, even if the capacitor C51 has been sufficiently charged or discharged, when the resistance of the N-Well resistor RNW51 becomes higher. This permits shortening of the delay time.

A feature of the present temperature detection circuit 12 is that it is made up of materials having no or less deviations in resistance resulting from the temperature dependency in the manufacturing process thereof, such as the polysilicon resistors and the N-Well resistors, likewise the first embodiment. Stable operation is assured when this circuit is implemented with semiconductor elements.

It is further obvious that the delay circuit 12 in the second embodiment exhibiting a shortening of a delay time with temperature rises may be combined with the delay circuit 12 in the first embodiment exhibiting a prolonging of a delay time with temperature rises in order to set up a temperature detection circuit.

Figure 6:
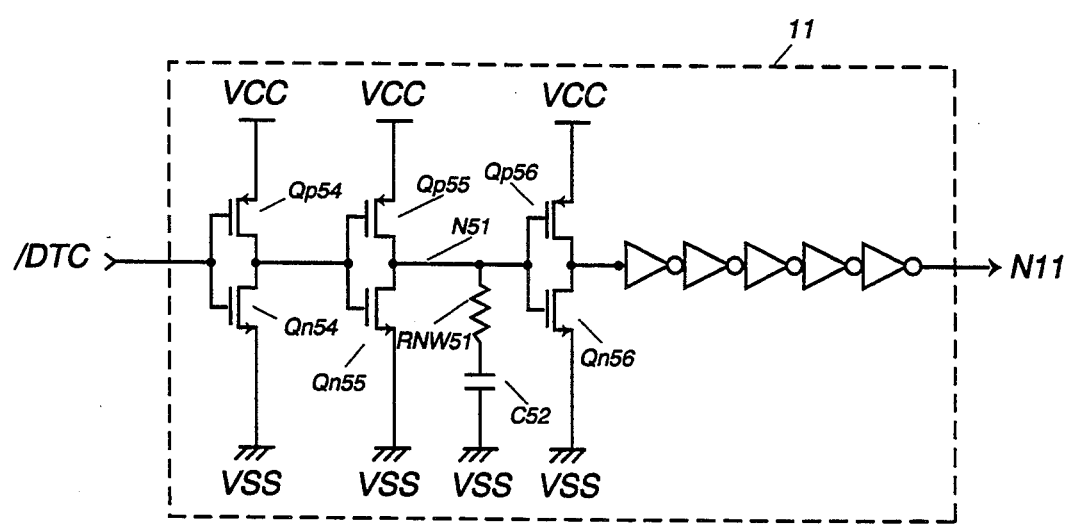
FIG. 6 is a circuit diagram of a temperature detecting circuit according to a third embodiment of the present invention.

In FIG. 6, there is illustrated a third embodiment wherein the first delay circuit 11 in the first embodiment is replaced with the delay circuit of FIG. 5. With temperature increases, the delay time of the delay circuit 11 of FIG. 6 becomes shorter and that of the delay circuit 12 of the first embodiment becomes longer. This embodiment is advantageous in that temperature detection may be achieved with high sensitivity even with a small temperature variation.

Figure 7:
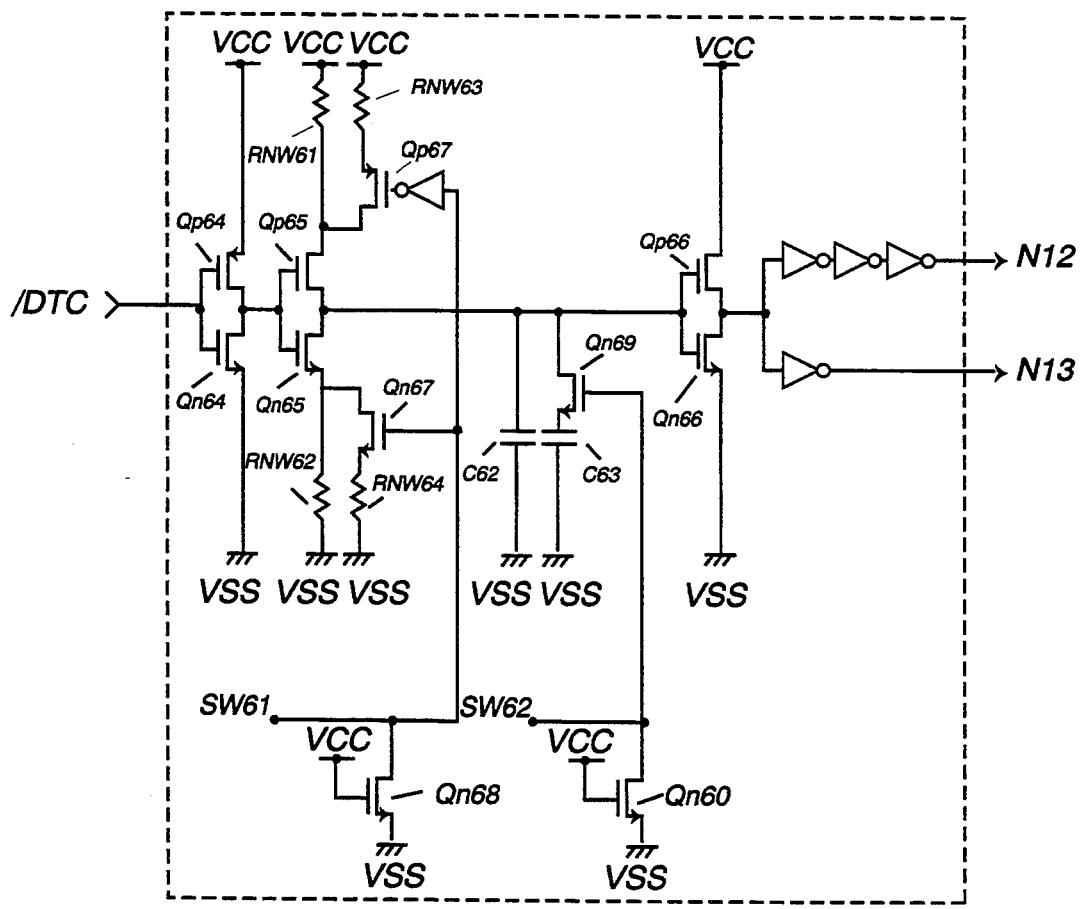
FIG. 7 is a circuit diagram of a temperature detecting circuit according to a fourth embodiment of the present invention.

Referring to FIG. 7, there is illustrated a temperature detection circuit according to a fourth embodiment of the present invention. Although this temperature detection circuit takes the advantage of the temperature dependency of the delay time 12 in a manner similar to the first or second embodiment, the delay time of the delay circuit 12 having a larger temperature dependency in terms of delay time is made variable with an external signal. A circuit diagram of the delay circuit 12 only is shown in FIG. 7.

There are illustrated P channel type MOS transistors Qp64–Qp69, N channel type MOS transistors Qn64–Qn67, capacitors C62–C63, N-Well resistors RNW61–RNW64, power supply voltage VCC, ground voltage VSS. Signals are designated/DTC. N12–N13 and SW61–Sw62.

Delay circuit 12 is composed of three-stage NOT circuit, followed by three-stage NOT circuit and parallel one-stage NOT circuit. The N-Well resistor RNW61 and the drain of the P channel type MOS transistor Qp67 are connected to the source of the P channel type MOS transistor Qp65 in the second stage NOT circuit. The capacitor C51 in the second stage NOT circuit is connected to the drains of the P channel type MOS transistor Qp55 and N channel type MOS transistor Qn55 via the N-Well resistor RNW51. The N-Well resistor RNW62 and the drain of the P channel type MOS transistor Qn67 are connected to the source of the N channel type MOS transistor Qn65. In addition, the N-Well resistor RNW63 is connected to the source of the P channel type MOS transistor Qp67, and the N-Well resistor RNW64 to the source of the N channel type MOS transistor Qn67.

The gate of Qn67 is supplied with signal SW61 and the gate of Qp67 is supplied with the inverse of signal SW61. The drain of Qn68 is supplied with signal SW61, with the gate thereof being supplied with power supply voltage VCC. The drains of Qp65 and Qn65 are connected together, with the junction thereof having capacitor C62 connected thereto and capacitor C63 via Qn69 whose gate receives SW62. SW62 is also fed to the drain of Qn66 which has the gate thereof supplied with power supply voltage VCC.

The signal SW61 is usually at logic level "L." Therefore, P channel type MOS transistor Qp67 and N channel type MOS transistor Qn67 are off. However, if the signal SW61 turns to logic level "H," then both of the P channel type MOS transistor Qp67 and the N channel type MOS transistor Qn67 turn on. This accelerates charging and discharging of a charge on the capacitor C62. In other words, if signal SW61 turns to logic level "H," then the delay time of the delay circuit 12 becomes shorter.

The signal SW62 is also usually at logic level "L." Therefore, N channel type MOS transistor Qn69 is off. When signal SW62 changes to logic level "H," the N channel type MOS transistor Qn69 turns on. The load capacitance of the second stage NOT circuit consists of the capacitors C62 and C63, with a resultant increase in load. In other words, the delay time of the delay circuit 12 is extended by bringing the signal SW62 to logic level "H." In this manner, the delay time of the delay circuit 12 is under control by the signals SW61 and SW62.

The present temperature detection circuit 12 is featured by that the delay time necessary for temperature detection is under control by the control signals SW61, SW62. In other words, it becomes possible to change the detecting temperature. For example, when the temperature detection circuit 12 serves to provide tempera-ture compensation against the temperature dependency and its deviations of the data hold time, the detecting temperature may be changed. For this reason, optimum temperature compensation may be provided to respective semiconductor devices.

Figure 8:
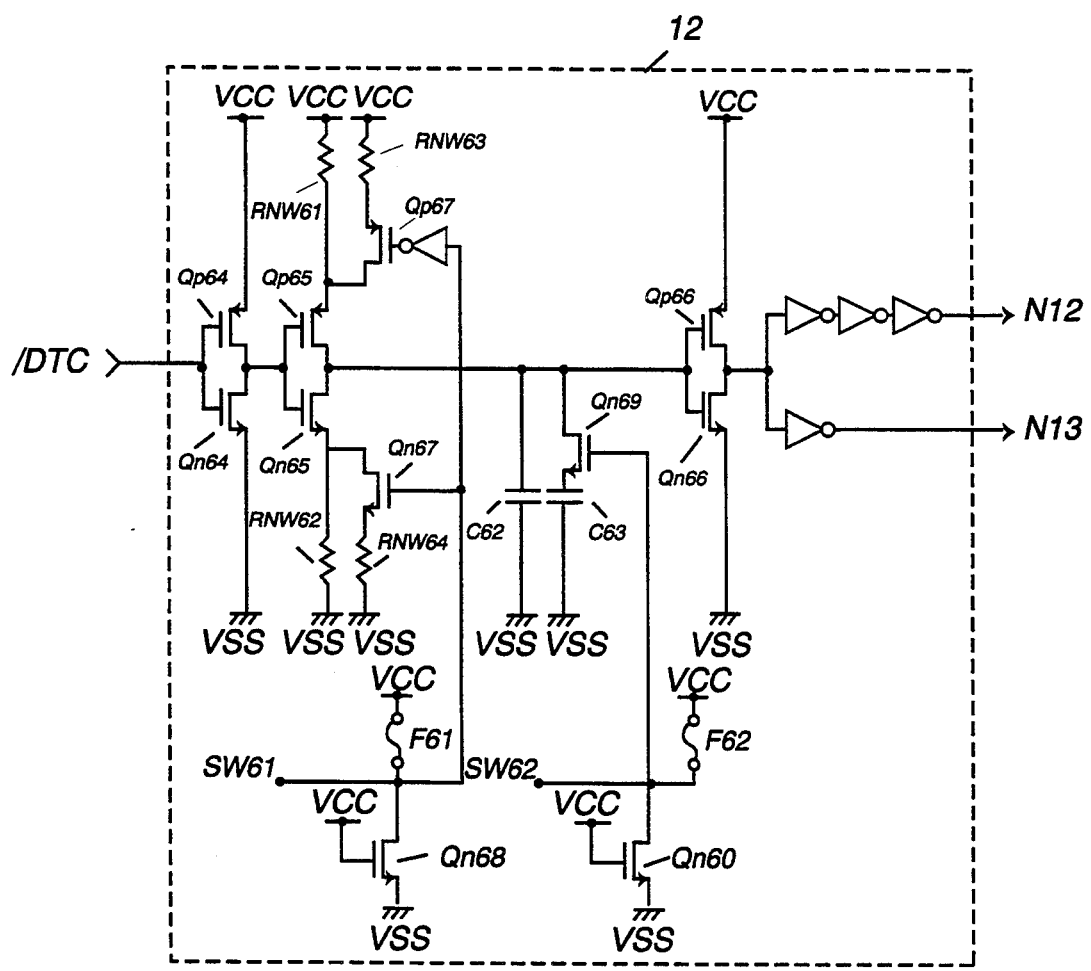
FIG. 8 is a circuit diagram of a temperature detecting circuit according to a fifth embodiment of the present invention.

Referring to FIG. 8, there is illustrated a temperature detection circuit according to a fifth embodiment of the present invention.

The temperature detection circuit of the fifth embodiment is similar to the above described fourth embodiment, except that a fuse 61 is inserted between the node of the signal SW61 and the power supply voltage VCC and that another fuse 62 is inserted between the node of the signal SW62 and the power supply voltage VCC. With this arrangement, the logic level of the signals SW61, SW62 is determined by whether to break the fuses F61, F62. When the fuse F61 is not broken, the logic level of the signal SW61 is "H." With the fuse F61 broken, the logic level of the signal SW61 is "L." This is the case with the logic level of the signal SW62.

Figure 9:
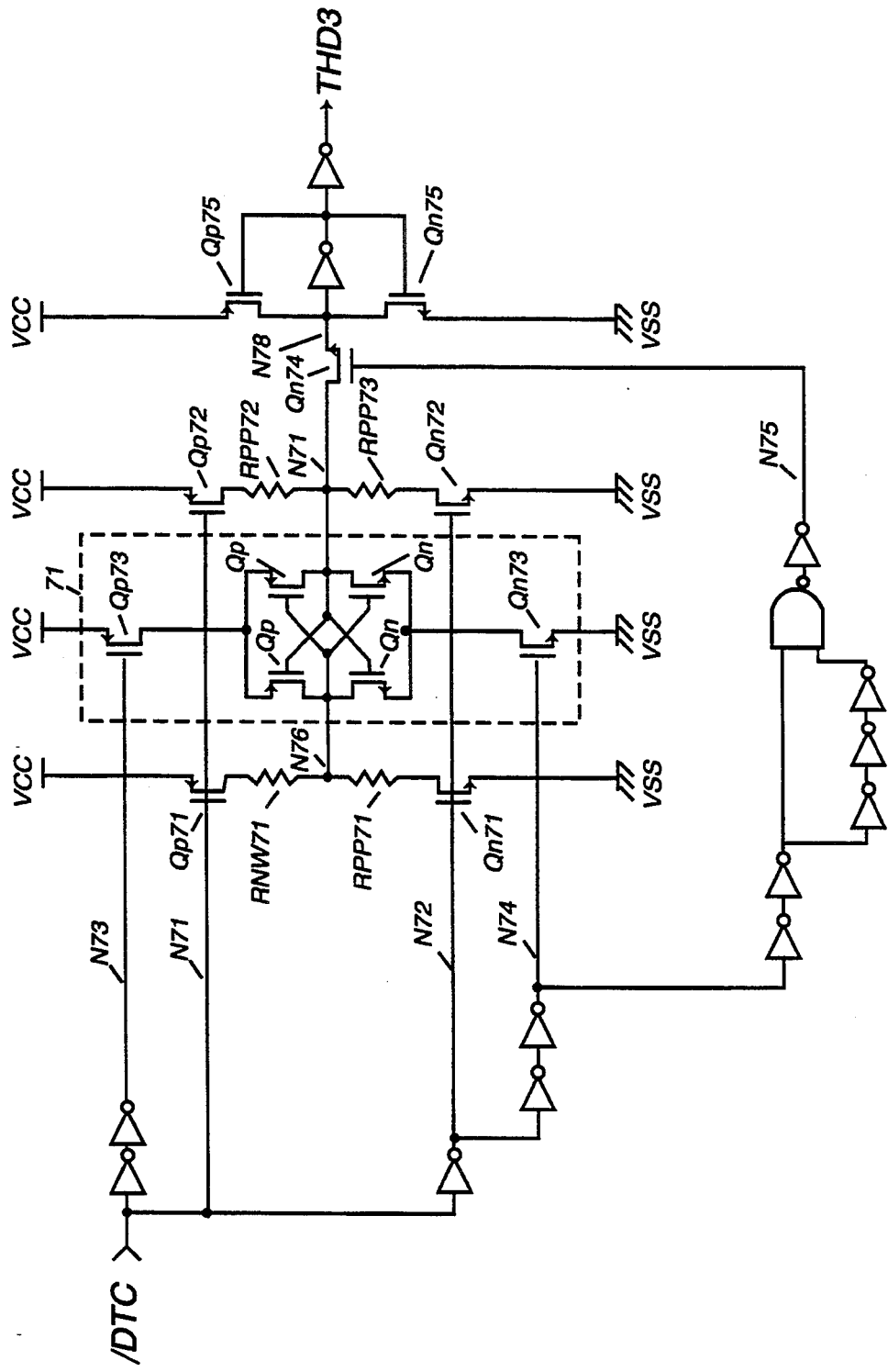
FIG. 9(a) is a circuit diagram of a DRAM according to the present invention.
FIG. 9(b) is a circuit diagram of a temperature detecting circuit according to a sixth embodiment of the present invention.
Figure 9:
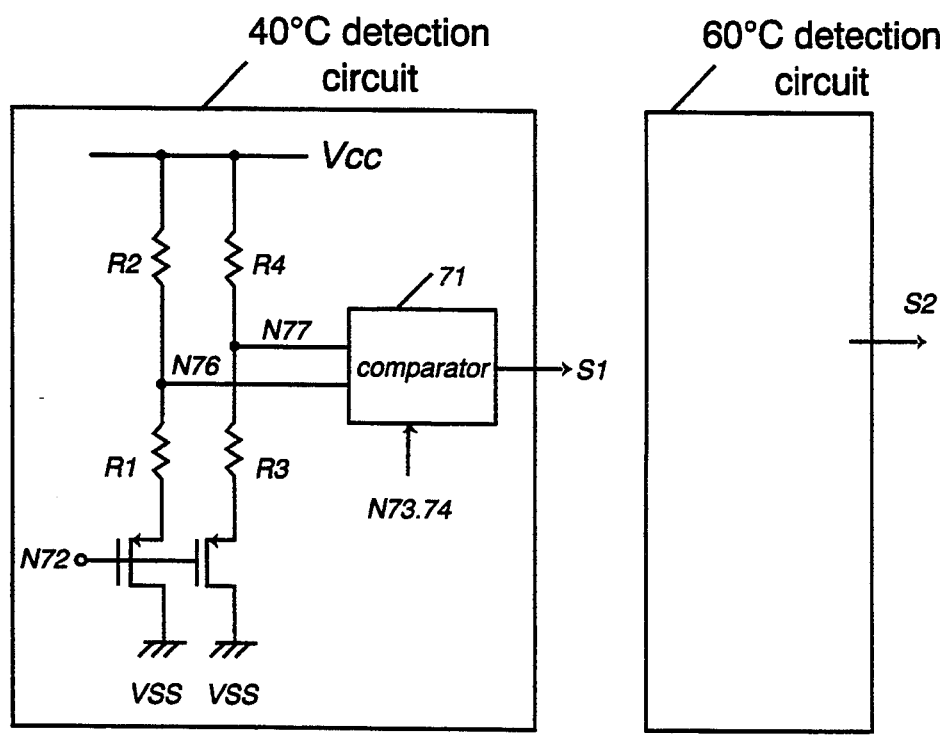
Figure 10:
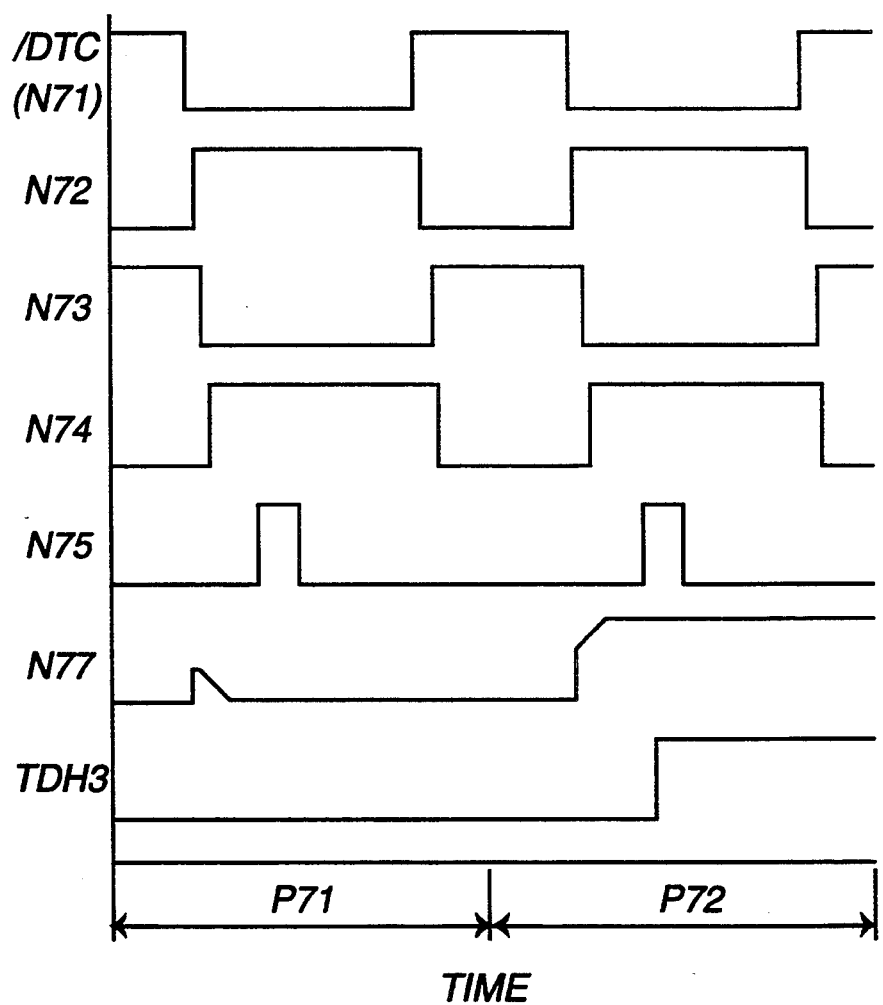
FIG. 10 is a signal waveform diagram of the DRAM and the temperature detecting circuit according to the sixth embodiment of the present invention.

FIG. 9(a) shows a circuit diagram of a DRAM with a circuit for sensing the difference in the resistances of resistors made of different materials according to the present invention, and FIG. 9(b) shows a schematic diagram of a temperature detection circuit. The temperature detection circuit according to a sixth embodiment of the present invention will be described, referring to FIG. 9(a) showing the circuit diagram and FIG. 10 showing a signal waveform diagram.

To sum up the present circuit, a first resistor and a second resistor are placed in series between a power supply voltage and a ground voltage. A third resistor and a fourth resistor are also placed in series between the power supply voltage and the ground voltage. Whereas the first and third resistors are made of same material, the second and fourth resistors are made of different materials. A potential difference between the junction of the first and second resistors and that of the third and fourth resistors is sensed to find a difference in resistance between the second and fourth resistors. It is to be noted that the second resistor is made up of material having a larger temperature dependency of its resistance and the fourth resistor is made up of material having a smaller temperature dependency of its resistance. The temperature detection circuit is completed by delivering the output indicative of the potential difference at the junction of the third and fourth resistors as temperature detection signal.

The first resistor in the foregoing summary description is implemented with resistor RPP71 of polysilicon and the second resistor with resistor RNW71 of N-Well. The third resistor is resistor RPP72 of polysilicon and the fourth resistor is resistor RPP73 of polysilicon. A circuit for amplifying the potential difference between the junction of the first and second resistors and that of the third and fourth resistors is signal amplifier circuit 71.

There are illustrated P channel type MOS transistors Qp, Qp71–Qp78, N channel type MOS transistors Qn, Qn71–Qn78, power supply voltage vCC, ground voltage VSS. Signals are designated/DTC, N71–N76 and TDH3.

The potential difference between the junction of the resistors RPP71 and RNW71 and that of the resistors RPP72 and RPP73 will be described in detail with reference to FIG. 9(a). For example, if it is desired to sense a temperature of 40° C., then the resistances of the resistors RNW71, RPP71, RPP72 and RPP73 are all set at 5000Ω. When temperature increases to 50° C. under the circumstances, the resistances of the resistors RNW71, RPP71, RPP72 and RPP73 assume 5324Ω, 5025Ω, 5025Ω, and 5025Ω, respectively, in view of the temperature-resistance relationship as illustrated in FIG. 2. When the power supply voltage VCC is 4 V at this time, node N76 is at 1942 mV and node at 2000 mV. This potential difference 58 mV is amplified via signal amplifier 71, providing temperature detection signal TDH3 of logic level "H." If temperature lowers to 30° C. under similar circumstances, then the resistances of the resistors RNW71, RPP71, RPP72 and RPP73 take 4722Ω, 4951Ω, 4951Ω, and 4951Ω, respectively. With the power supply voltage VCC of 4 V, node N76 is at 2047 mV and node N77 is at 2000 mV. This potential difference 47 mV is amplified via signal amplifier 71, providing temperature detection signal TDH3 of logic level "L." Since the potential difference which may be amplified with the signal amplifier 71 with accuracy is approximately 15 mV, error in temperature detection at this moment would be +3° C.

The above circuit arrangement operates as follows:

When the signal/DTC (N71) is at logic level "H," the signals N71 and N73 are at logic level "H" and the signals N72 and N74 are at logic level "L."

The P channel type MOS transistors Qp71-Qp73 and the N channel type MOS transistors Qn71-Qn73 are off. Therefore, no current flows through the signal amplifier, the polysilicon resistor RPP71, RPP72 or the N-Well resistor RNW71 from the power supply voltage VCC to the ground voltage VSS. The signal N75 is at logic level "L" and the signals N78 and TDH3 remain unchanged in terms of logic level.

If the signal/DTC (N71) lowers to logic level "L," the signal N71 takes logic level "L" and the signal N72 takes logic level "H." When this occurs, the signals N76, N77 assume a resistor-divided potential from the power supply voltage VCC by the polysilicon resistors RPP71-RPP72 and the N-Well resistor RNW71. Thereafter, when the signal N73 takes logic level "L" and the signal N74 takes logic level "H," the signal amplifier circuit 71 is activated to amplify the potentials of the signals N76, N77.

Furthermore, if a pulse signal of logic level "L" is applied to the signal N75, then the logic level of the signal N77 is transferred to the signal N78 and becomes fixed. In other words, the signal TDH3 takes the same logic level as the signal N78. As long as the signal TDH3 is at logic level "L," the resistance of the N-Well resistor RNW71 is lower than that of the polysilicon resistor RPP72. On the other hand, if the signal TDH3 is at logic level "H," then it indicates that the resistance of the N-Well resistor RNW71 is higher than that of the polysilicon resistor RPP72. As is obvious from FIG. 2, the resistance of the N-Well resistor exhibits a larger temperature dependency and thus increases with temperature rises. The polysilicon resistor, however, shows a smaller temperature dependency. The illustrated temperature detection circuit takes advantage of these temperature dependencies and supplies the temperature detection output on the basis of the logic level of the signal TDH3.

In FIG. 10, temperature during the period P71 is lower than that during the period P72.

A feature of the DRAM with the circuit for sensing the difference in resistance or the temperature detection circuit lies in that the different temperature dependencies of the polysilicon resistor and the N-Well resistor are utilized and materials with no or little deviations in the manufacturing process thereof are used for the setup thereof.

As discussed above, the detection circuit is applicable to use with semiconductor elements, with stability of operation. Moreover, the application of the detection circuit may be expanded and diversified to a number of different types of semiconductor elements since the temperature detection signal may be delivered in form of digital signals. The temperature dependencies of different kinds of resistors may also be evaluated.

Whereas the specific resistances and other values have been discussed for detecting a temperature of 40° C., it is obvious to those skilled in the art that a plurality of the above illustrated circuit are prepared for detecting another temperature, for example, 60° C. In other words, it is possible to detect a plurality of temperatures.

FIG. 9(b) is a schematic diagram for simplifying the setup shown in FIG. 9(a). Resistor R2, resistor R1 and a switching transistor are connected in series between power supply voltage VCC and ground voltage VSS. Similarly, resistor R4, resistor R3 and a switching transistor are connected in series between the power supply voltage VCC and ground voltage VSS. The gates of these transistors are supplied with a common control signal N72. Node N76 leading from the junction between the resistors R2, R1 and node N77 from the junction between the resistors R4, R3 are connected to inputs to comparator 71 which also receives control signals N73, N74. Output signal S1 from the comparator 71 is a detection signal from the temperature detection circuit, which is indicative of a temperature of 40° C. A second temperature detection circuit of a similar structure is connected in parallel for detection of 60° C.

Figure 34:
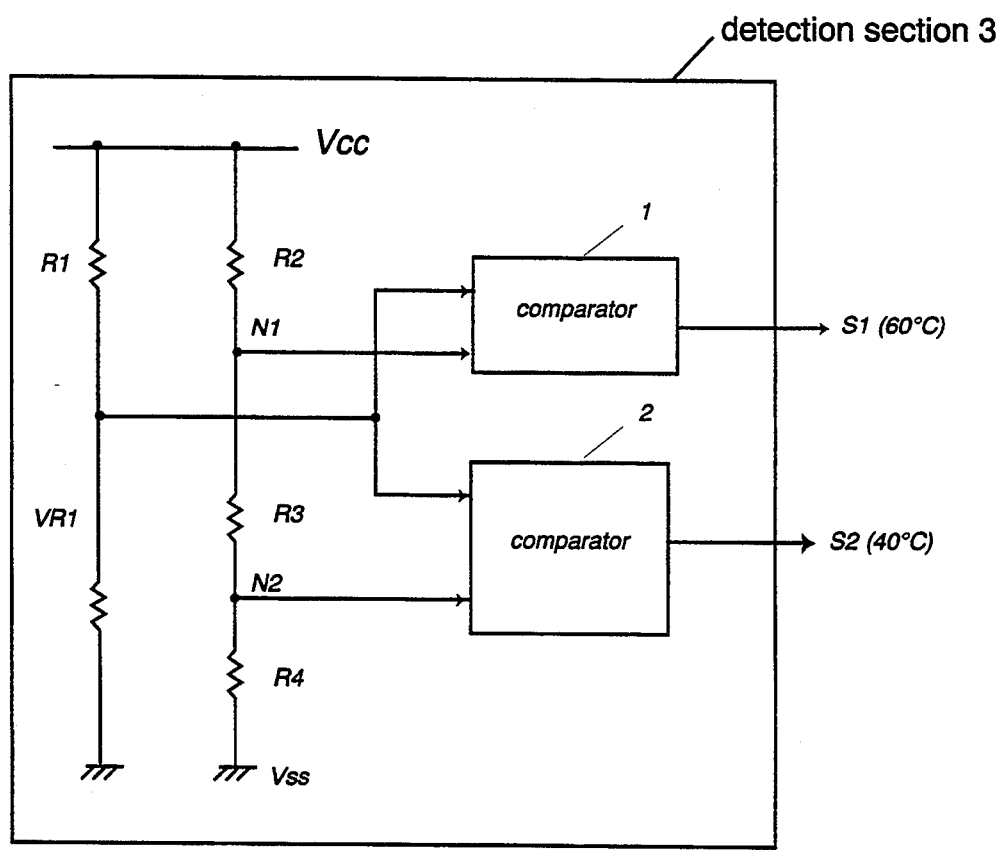
FIG. 34 is a circuit diagram for explanation of a conventional temperature detecting circuit.

Should the resistor R2 be composed of a resistor of a larger temperature dependency (i.e., N-Well resistor) the resistors R1, R3, R4 composed of a resistor of a smaller temperature dependency (i.e., polysilicon resistor), the 40° C. detection circuit might be designed under the condition of R1=R2=R3=R4. Unlike the conventional temperature detection circuit as shown in FIG. 34, the resistors R1, R3, R4 in this embodiment each may be made by a resistor of the same material and same shape. This would result in a minimum of manufacturing deviations in forming these resistors. A resistance compensation circuit for compensating against deviations in resistance is needed only for the resistor R2, if necessary. Because the 40° C. and 60° C. detection circuits are independent of each other, the comparator 71 may be designed to supply a current flow toward the nodes N76, N77. The switching transistors are controlled by control signal N72. A low power consumption temperature detection circuit may be implemented, because current may be permitted to flow between the power supply voltage VCC and the ground voltage VSS, if and only if necessary, and the comparator 71 may be activated by the control signals N73, N74 if and only if necessary.

Figure 11:
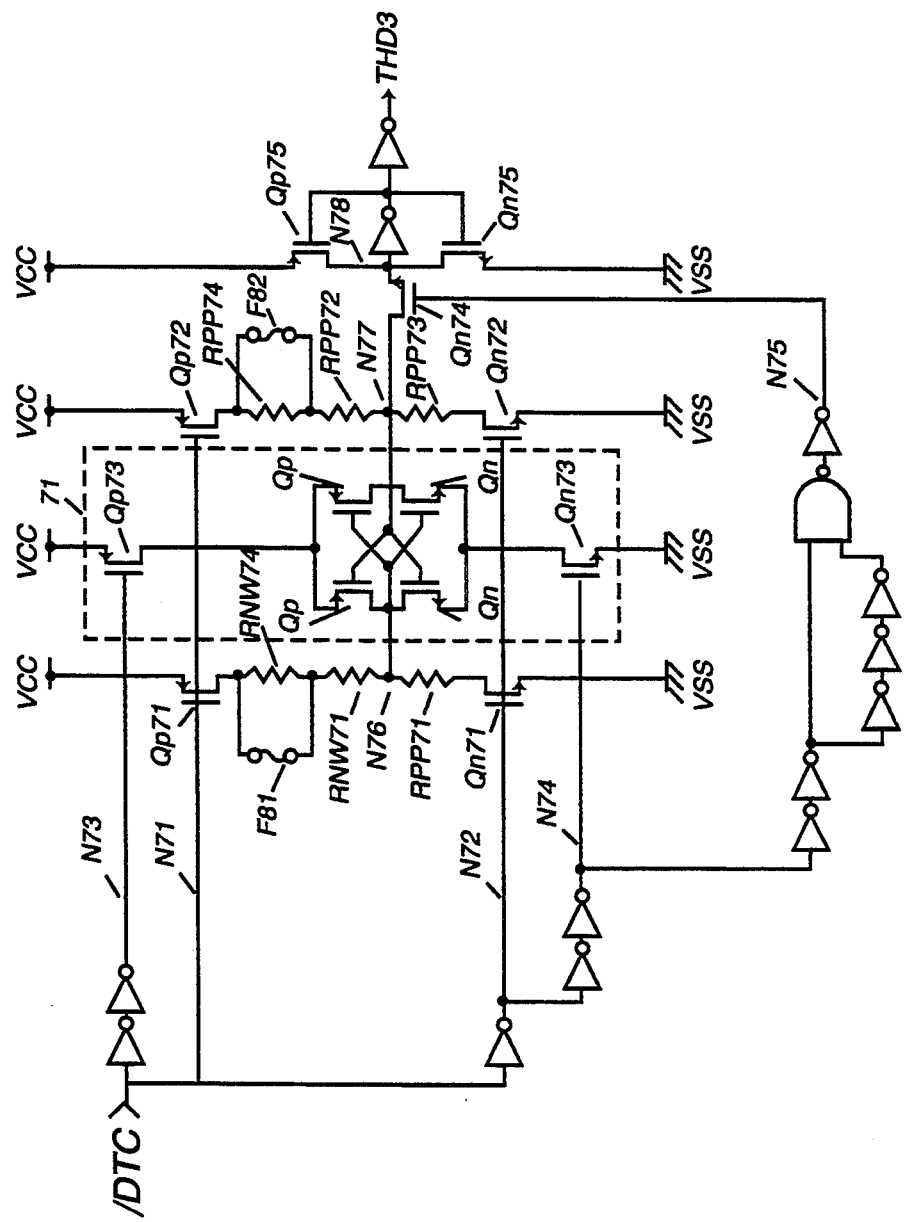
FIG. 11 is a circuit diagram of a temperature detecting circuit according to a seventh embodiment of the present invention.

Referring to FIG. 11 showing a circuit diagram, a temperature detection circuit according to a seventh embodiment of the present invention. This temperature detection circuit is different over the temperature detection circuit according to the sixth embodiment in that the second and fourth resistors are variable in resistance. The circuit operation of this embodiment is similar to that of the sixth embodiment.

The second resistor is completed by N-Well resistors RNW71, RNW74 together with fuse F81 in parallel with the N-Well resistor RNW74. The second resistor may be changed, depending upon whether the fuse F81 is broken. Similarly, the fourth resistor is made of the polysilicon resistors RPP72, RPP74 and a fuse F82 connected in parallel with the polysilicon resistor RPP74. The resistance of the fourth resistor is changed, depending upon whether to break the fuse F82.

The temperature detection circuit according to the seventh embodiment features, in addition to enjoying the advantages of the sixth embodiment, that the resistances of the N-Well resistors and the polysilicon resistors may be modified and adjusted readily if the resistances deviate from their intended target values. It becomes easier to build up a circuit having intended designed values. Usually, the resistances may suffer from a deviation of ±10% in the manufacturing process.

Figure 12:
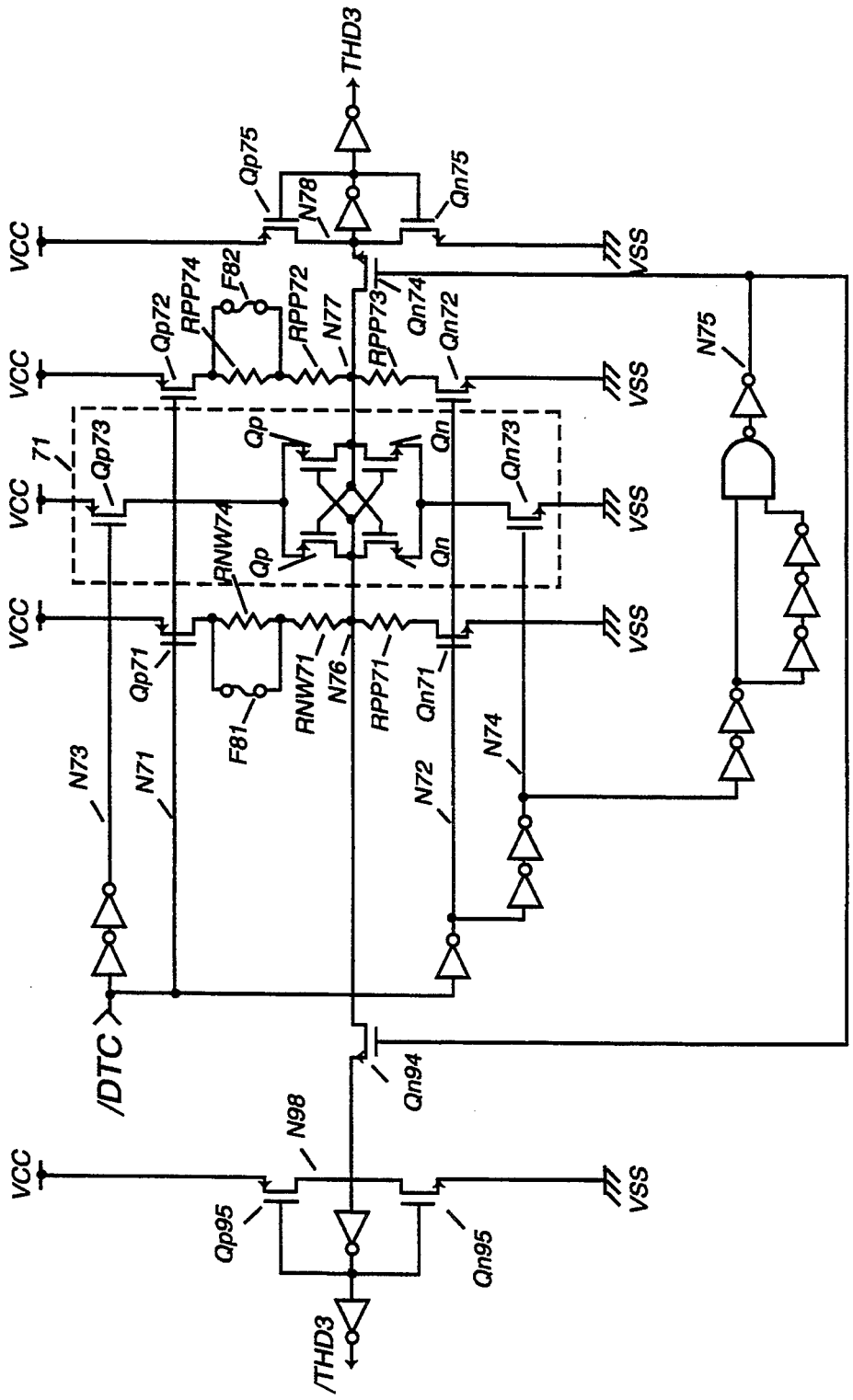
FIG. 12 is a circuit diagram of a temperature detecting circuit according to an eighth embodiment of the present invention.

Referring to FIG. 12 showing a circuit diagram, there will be described and illustrated a temperature detection circuit according to an eighth embodiment of the present invention.

This temperature detection circuit is a modification over the seventh embodiment for eliminating unbalanced load between node N76 and node N77. Node N76 is connected to node N98 via N channel type MOS transistor Qn94. The output of a one-stage NOT circuit connected to node N98 is fed to the gates of P channel type MOS transistor Qp95 and N channel type MOS transistor Qn95. The drains of Qp95 and Qn95 are led to node N76. The source of Qp95 is connected to power supply voltage VCC and the source of Qn95 is connected to ground voltage VSS. The output of a one-stage NOT circuit connected to the gate of Qp95 is derived as signal/THD3. The above arrangement eliminates unbalanced load between nodes N76 and N77, permitting the signal amplifier circuit 71 to amplify even a small potential difference between nodes N76 and N77 with accuracy.

Figure 13:
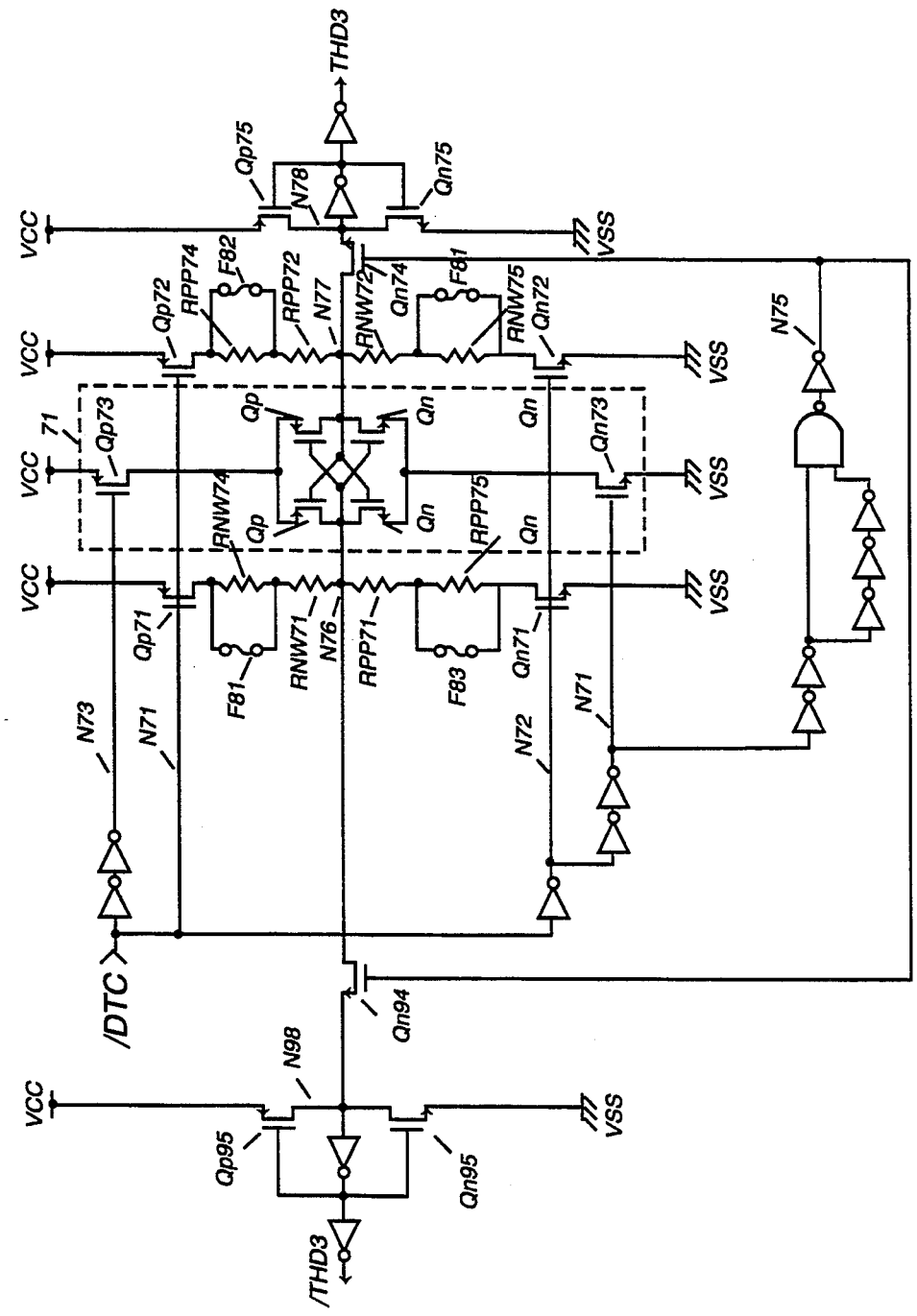
FIG. 13 is a circuit diagram of a temperature detecting circuit according to a ninth embodiment of the present invention.

Referring to FIG. 13 showing a circuit diagram, there will be described and illustrated a temperature detection circuit according to a ninth embodiment of the present invention.

This temperature detection circuit is characterized by that the polysilicon resistor RPP73 in the seventh embodiment is replaced with N-Well resistor RNW72 in order to enhance the potential difference for amplification by the signal amplifier circuit 71.

Actual enhancement of amplification gain or potential difference will be discussed in detail. For example, if it is intended to sense a temperature of 40° C., then the resistances of the resistors RNW71, RNW72, RPP71 and RPP72 are all set at 5000Ω. When temperature increases to 50° C. under the circumstances, the resistances of the resistors RNW71, RNW71, RPP71 and RPP72 assume 5324Ω, 5324Ω, 5025Ω, and 5025Ω, respectively, in view of the temperature-resistance relationship as illustrated in FIG. 2. When the power supply voltage VCC is 4 V at this time, node N76 is at 1942 mV and node at 2058 mV. This potential difference 116 mV is amplified via signal amplifier 71, providing temperature detection signal TDH3 of logic level "H." If temperature lowers to 30° C. under similar circumstances, then the resistances of the resistors RNW71, RNW72, RPP71 and RPP72 take 4722Ω, 4722lΩ, 4951Ω, and 4951Ω, respectively. With the power supply voltage VCC of 4 V, node N76 is at 2047 mV and node N77 is at 1953 mV. This potential difference 94 mV is amplified via signal amplifier 71, providing temperature detection signal TDH3 of logic level "L." The potential difference attained with this embodiment increases to be twice higher than that in the fifth embodiment, thus assuring stable amplification operation of the signal amplifier 71.

Figure 14:
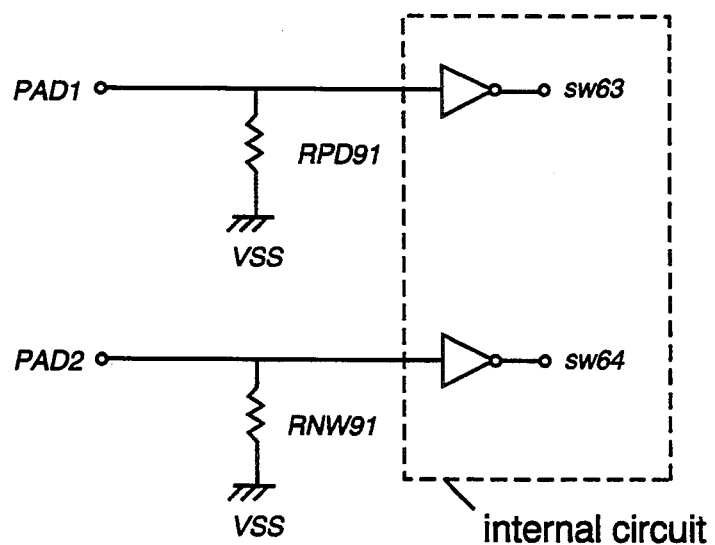
FIG. 14 is a circuit diagram of a resistance compensation monitor in the temperature detecting circuit according to the present invention.

In FIG. 14, a resistance compensation monitor circuit for determining resistance compensation values is illustrated, which circuit is used when the intended resistance values are attained by breaking the fuses as in the temperature detection circuit according to the sixth and seventh embodiments of the present invention.

This circuit is established by polysilicon resistor RPP91 inserted between terminal PAD1 of a device and ground voltage VSS and N-Well resistor RNW91 inserted between terminal PAD2 of the device and ground voltage VSS. The terminals PAD1, PAD2 are connected to an internal circuit (i.e., the gates of MOS transistors forming a NOT circuit). In the illustrated circuit, a given voltage is applied to terminal PAD1. Under the circumstance, the resistance of the polysilicon resistor RPP91 is evaluated by measuring current flowing through the terminal PAD1. Similarly, the resistance of the N-Well resistor RNW91 is evaluated by applying a given voltage to the terminal PAD2 and measuring current through the terminal PAD2. The resistances of the polysilicon resistors and the N-Well resistors in the temperature detection circuit as shown in the sixth or seventh embodiments are then adjusted or compensated to proper values by using the evaluated resistance values. The polysilicon resistor RPP91 and the N-Well resistor RNW91 used in the circuit of FIG. 13 are of the same shape as that of the polysilicon resistors and the N-Well resistors in the temperature detection circuits according to the sixth and seventh embodiments.

The resistances of the temperature detection circuit may be compensated to the resistance values which are evaluated with the above illustrated monitor circuit. In this manner, a proper compensation may be made for a respective one of devices.

Referring now to FIGS. 15 to 19, there is illustrated and described a self-refresh DRAM according to a first embodiment of the present invention.

DRAM accomplishes storing (and holding) of data by either accumulating a charge on a capacitor formed inside the DRAM or not accumulating the charge. The charge accumulated on the capacitor will disappear after a long period of time passed by. To this end, refresh operation is needed which rewrites the charge on the capacitor at a certain interval of time. The DRAM which contains a built-in timer circuit for initiating the refresh operation automatically is called "self-refresh" DRAM.

Figure 15:
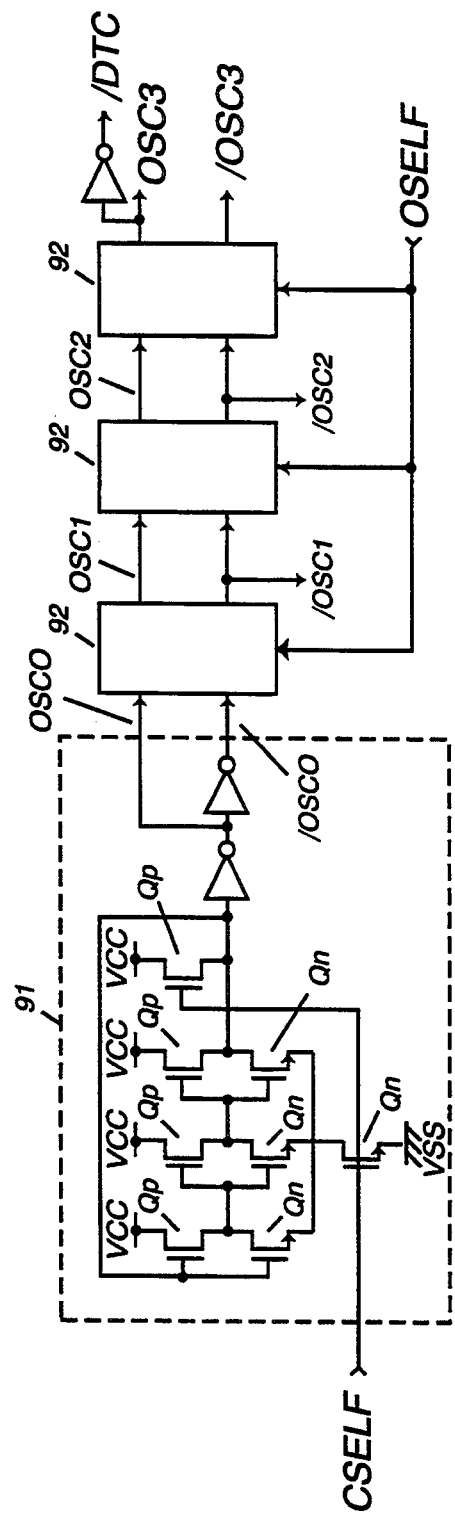
FIGS. 15 to 17 are circuit diagrams of a first embodiment of a DRAM with a temperature detecting circuit according to the present invention.
Figure 16:
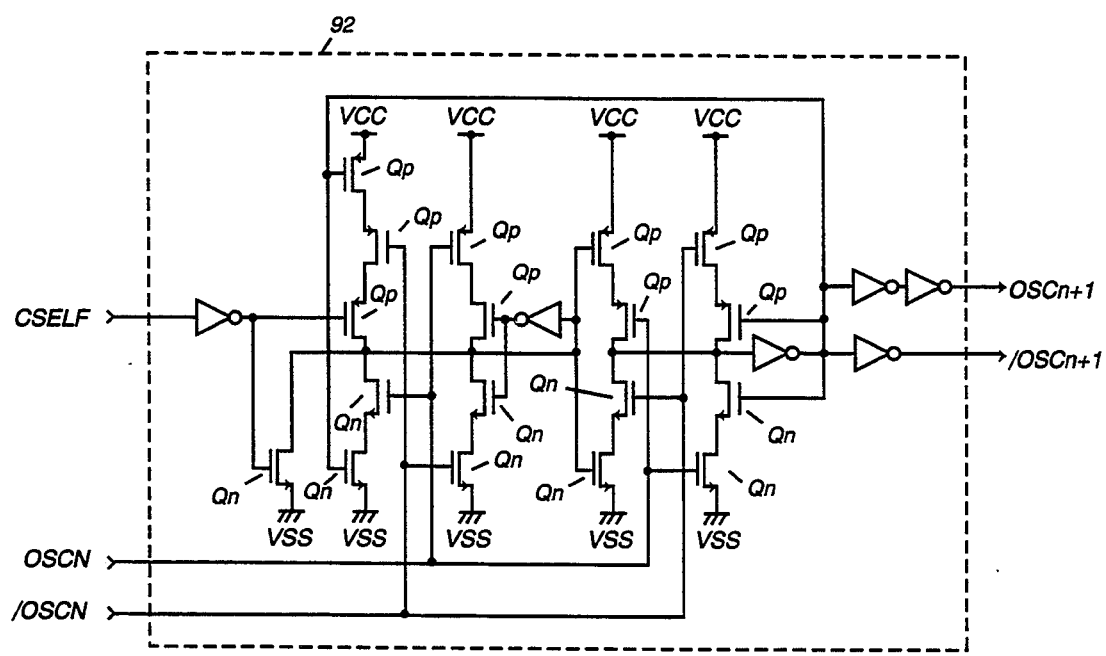
Figure 17:
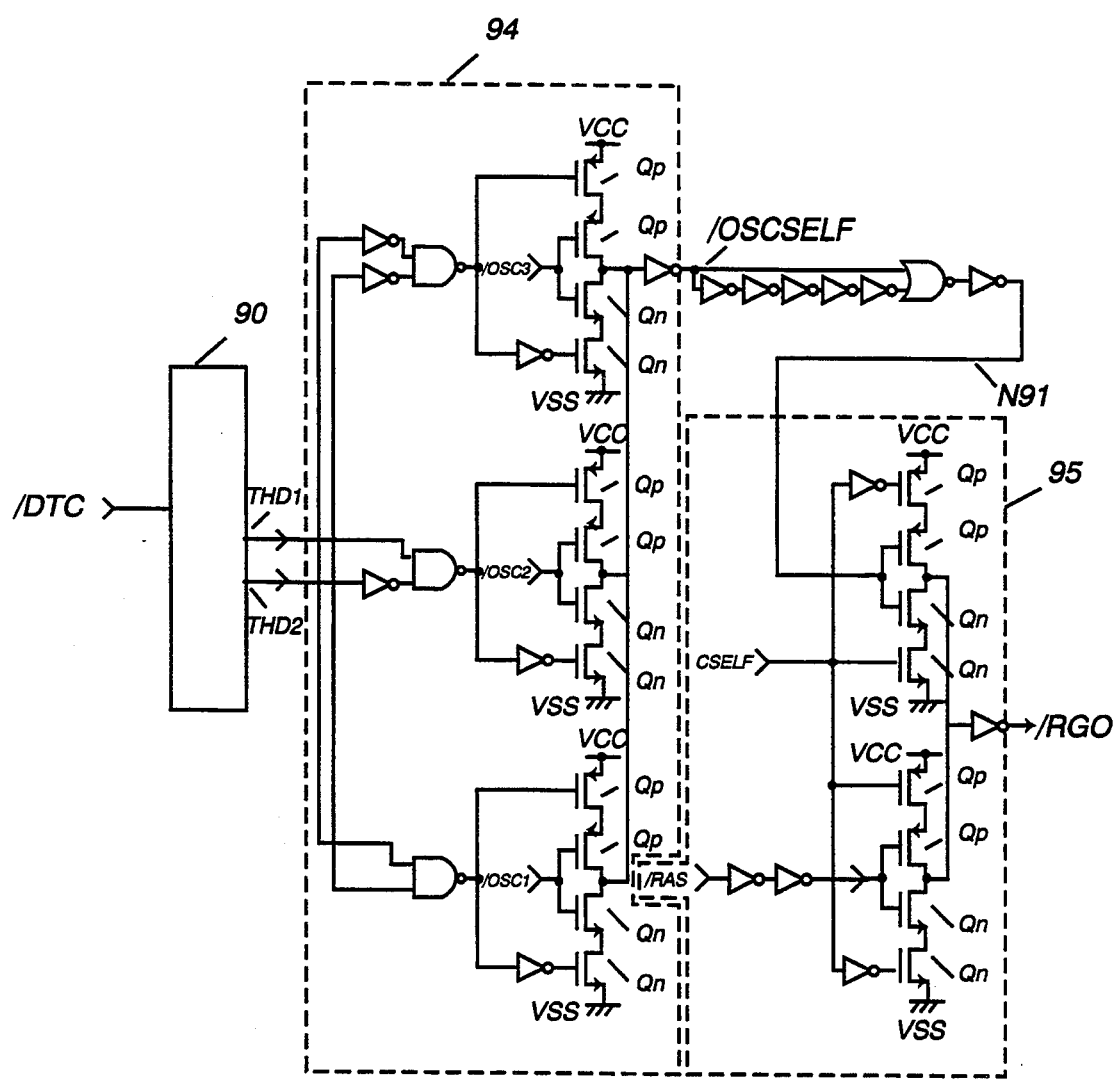
Figure 18:
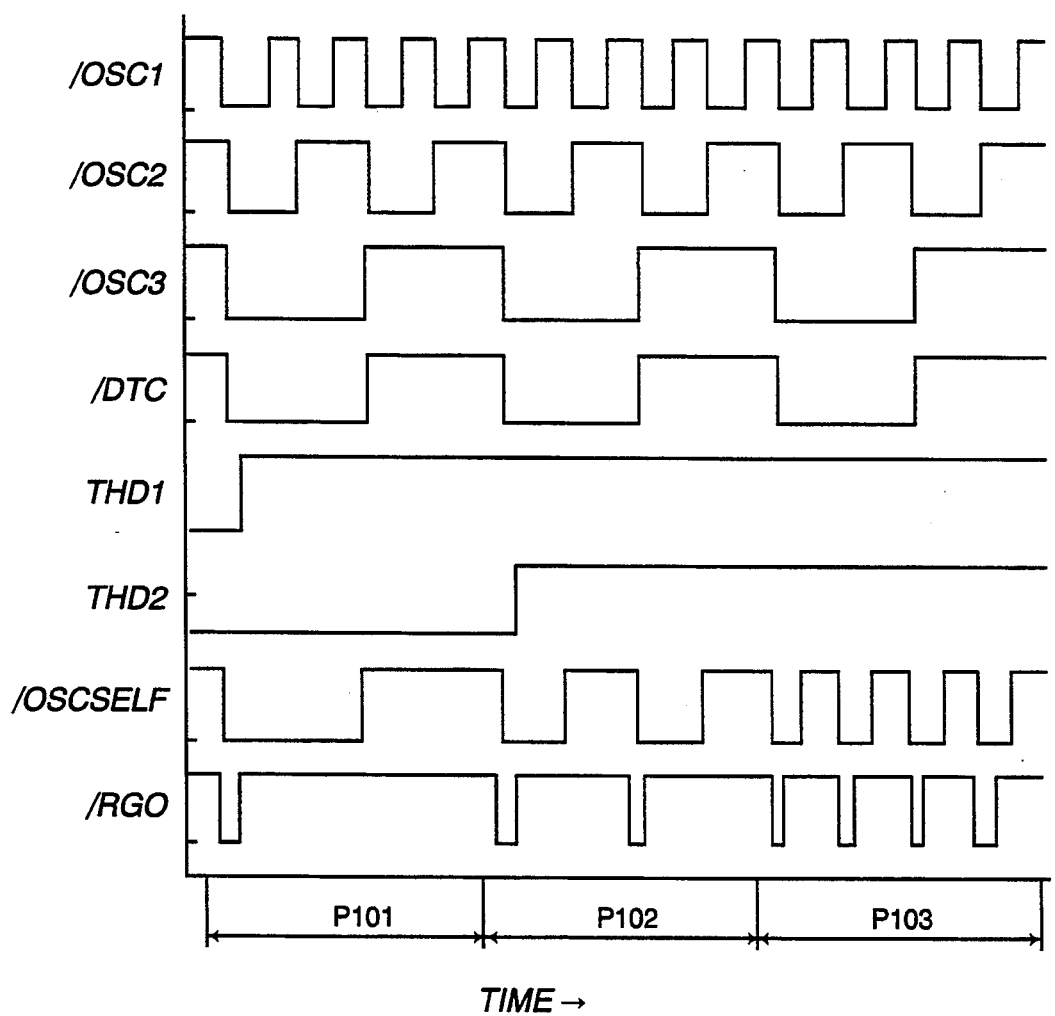
FIG. 18 is a signal waveform diagram of the first embodiment of the DRAM with the temperature detecting circuit according to the present invention.

The DRAM to be described hereinafter uses the temperature detection circuit as fully described in the foregoing description to expand the interval of self-refresh operation with low temperatures. This makes it possible to reduce power consumption required for the self-refresh operation at low temperatures, as compared with the conventional DRAM. FIGS. 15-17 are circuit diagrams for implementing the self-refresh operation according to the present invention, and FIG. 18 is a signal waveform diagram of this circuit arrangement.

There are illustrated an oscillator 91, frequency dividers (counters) 92, a P channel type MOS transistor Qp, an N channel type MOS transistor Qn, power supply voltage VCC and ground voltage VSS. Periods of time are designated as P101–P103 and signals as /DTC, THD1, THD2, CSELF, OSCn, /OSCn, /OSCSELF, /RG0, /RAS and N91.

The oscillator 91 of FIG. 15 receives the signal CSELF as input and supplies the signal/OSCO as output. The oscillator 91 is disabled when the signal CSELF is at logic level "L." Under the circumstance, the signal OSCO is fixed at logic level "L" and the signal /OSCO at logic level "L."

When the self-refresh operation starts, the signal CSELF rises up to logic level "H" and the oscillator 91 starts to operate. The signals OSCO, /OSCO generate signals of certain intervals as shown in FIG. 18. The signals are fed to the first frequency divider (counter) 92 for ½ division of interval. The divider 92 provides the signals OSC1, /OSC1. The signals OSC1,/OSC1, OSC2,/OSC2, OSC3 and/OSC3 are developed in a similar manner as depicted in FIG. 18.

FIG. 16 shows a circuit diagram of the frequency divider (counter) 92. The divider 92 is enabled when the signal CSELF is at logic level "H." In response to the temperature detection signals THD1, THD2, one of the periodic oscillation signals OSC1, /OSC1, OSC2, /OSC2, OSC3, /OSC3 is selected as the self refresh interval signal /OSCSELF. This selection is made with a switch circuit 94 of FIG. 17. Node N91 is designed to supply a one-shot pulse signal of logic level "L" at the leading edge of the self refresh interval signal/OSCSELF. The switching circuit 95 makes selection between activation and disablement of the self-refresh operation.

When the self-refresh operation is enabled, the signal CSELF is at logic level "H." Signal of the same phase as that of the signal N91 is derived as the signal /RGO. The signal /RGO is refresh control signal.

As illustrated in FIG. 18 or a signal waveform diagram, the self refresh interval during the period P101 where temperature is below 40° C. is equal to the interval of the signals OSC3, /OSC3. The self refresh interval during the period P102 where temperature is higher than 40° C. but lower than 60° C., is equal to the interval of the signals OSC2, /OSC2. Moreover, the self refresh interval during the period P103 where temperature is above 60° C, is equal to the interval of the signals OSC1, /OSC1.

In this manner, the temperature detection signals THD1, THD2 change the refresh interval for each of the three different temperature zones with boundaries of 40° C. and 60° C. The present invention realizes and implements the build-up of DRAMs which accomplish the optimum self refresh operation within three or more different temperature zones.

When the self refresh operation is disabled, the signal CSELF is at logic level "L." At this moment, the oscillator 91 does not operate and the signals /OSCSELF and N91 remain at logic level "H." The signal /RG0 is signal of the same phase as that of the external control signal /RAS.

Figure 19:
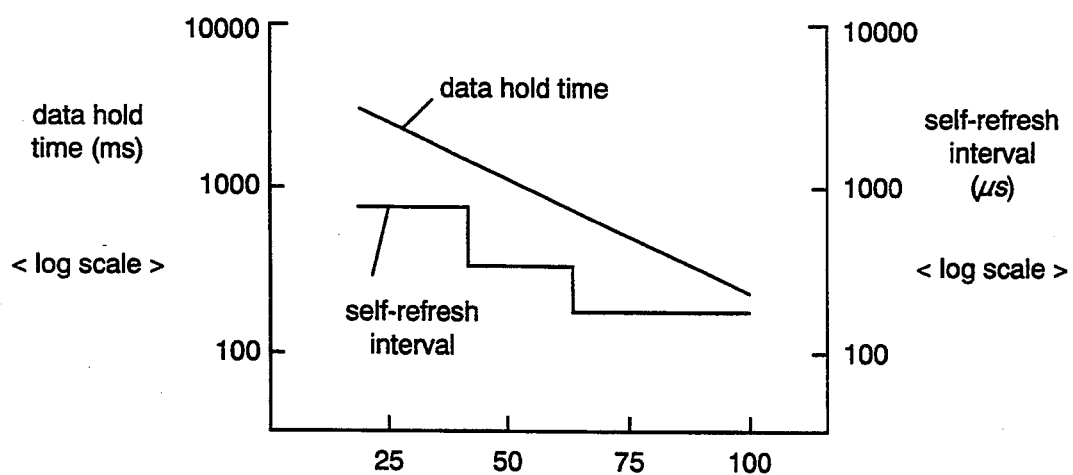
FIG. 19 is a graph showing the relationship between the data hold time and temperature of DRAMs with the temperature detecting circuit according to the present invention.

FIG. 19 is a graph showing the relationship among the temperature of the self-refresh DRAM, the self-refresh interval when the self-refresh operation is enabled, and the data hold time of DRAM memory cells. It is evident from the graph that in no event does the data hold time of the memory cells become shorter than the self-refresh interval, with no possible failure to refresh, within a range from 25° C. to 100° C.

A feature of the self-refresh DRAM lies in that it contains the temperature detection circuit with no or little manufacturing deviations. Therefore, the refresh interval when the self-refresh operation is enabled at low temperature may be extended to be a multiple integer longer than a given reference interval, so that the self-refresh operation may be accomplished at the optimum refresh interval within a wide range of temperature. At low temperature, the self-refresh interval may be expanded, with accompanying reduction of power consumption. At high temperature, it is less likely that failure to refresh would happen, as compared with the conventional DRAMs. Reduced power consumption during the self-refresh operation at low temperature saves the life of batteries.

Referring next to FIGS. 20 to 23, there will be described and illustrated a DRAM having CBR (CAS Before RAS) refresh function according to an embodiment of the present invention.

Usually, DRAMs perform the refresh operation in response to an external control signal and externally applied refresh address signals. On the other hand, the CBR refresh operation is performed at internal addresses in response to an external control signal and internal address signals internally automatically generated. Whereas in the above embodiment the refresh interval is automatically generated inside the DRAM during the self-refresh operation, the refresh interval of the CBR refresh operation is under control by an external control signal. The DRAM illustrated herein uses the temperature detection circuit as discussed above.

In the illustrated embodiment, at low temperature there is created an interval or intervals where no CBR refresh operation is performed. There is no need for power consumption for the CBR refresh operation, at low temperature.

Figure 20:
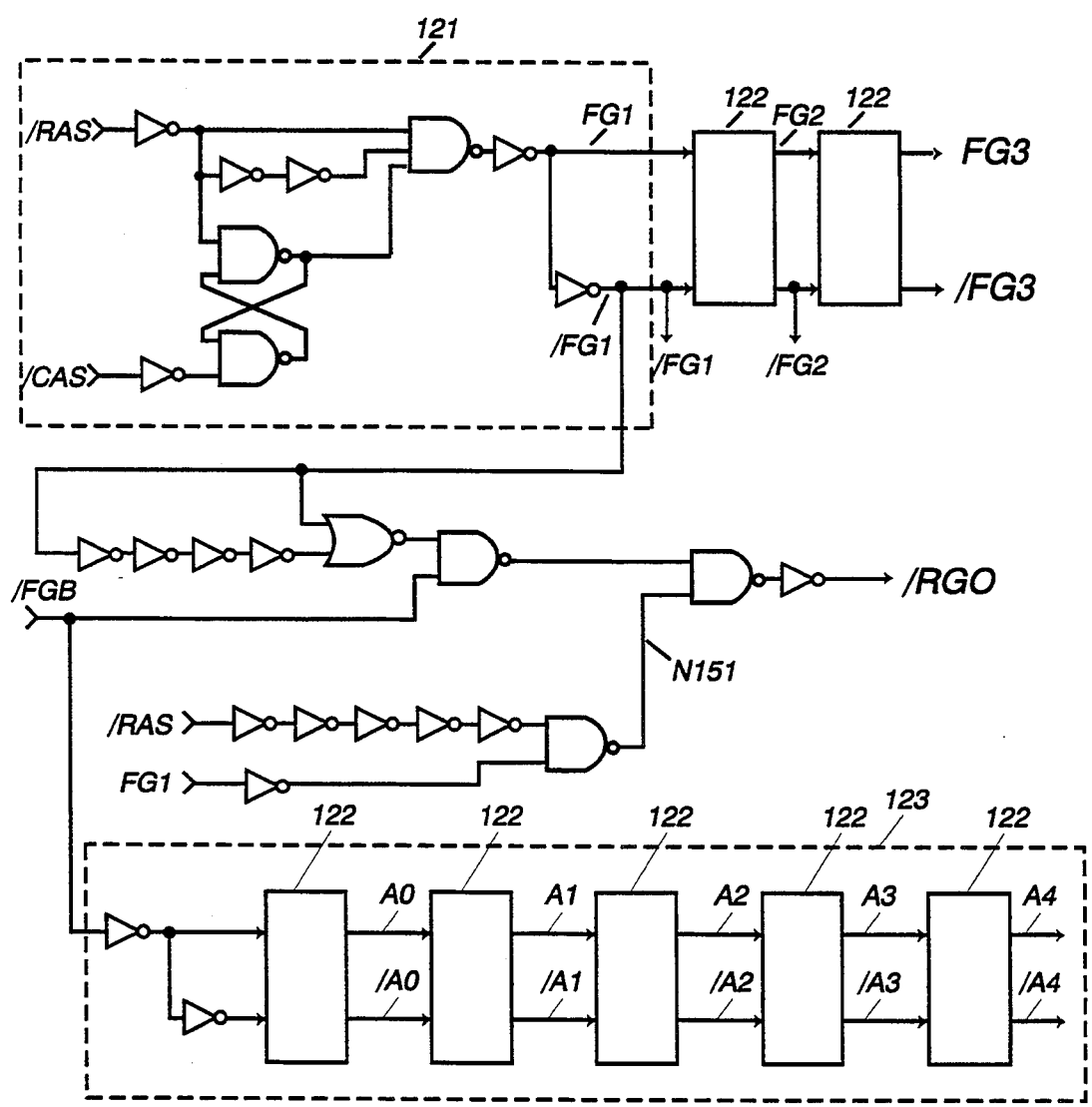
FIGS. 20 to 22 are circuit diagrams of a second embodiment of a DRAM with a temperature detecting circuit according to the present invention.
Figure 21:
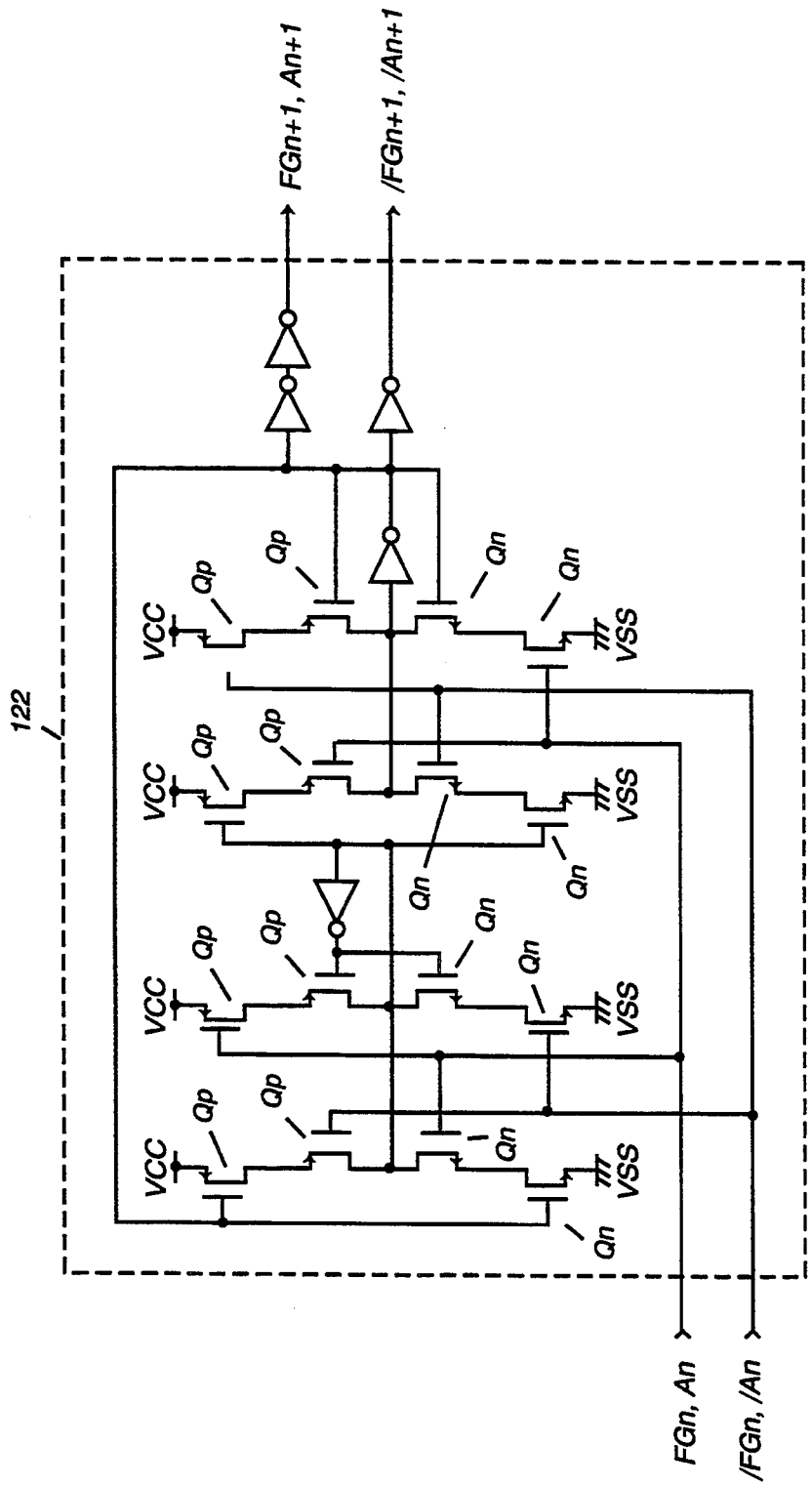
Figure 22:
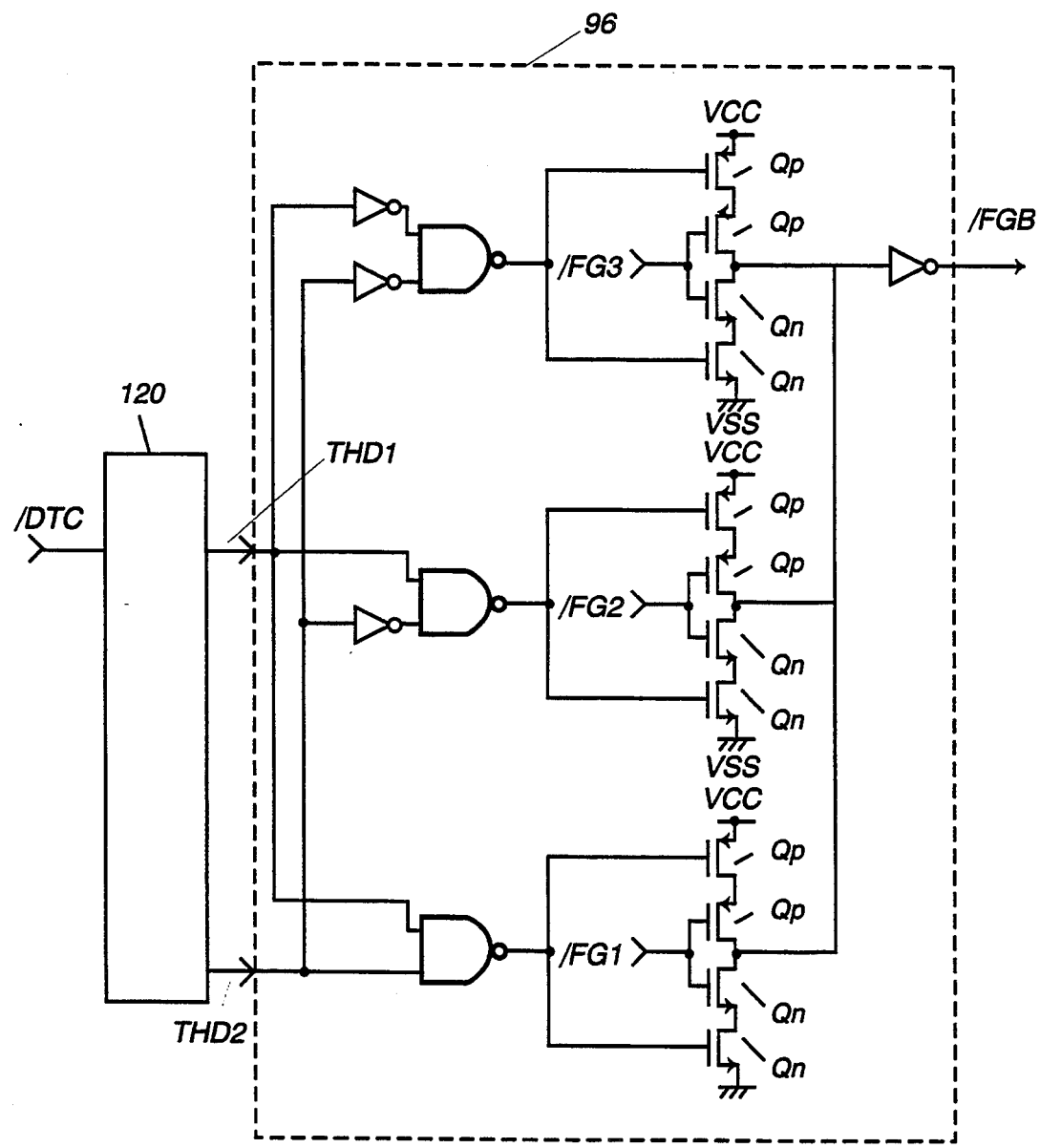
Figure 23:
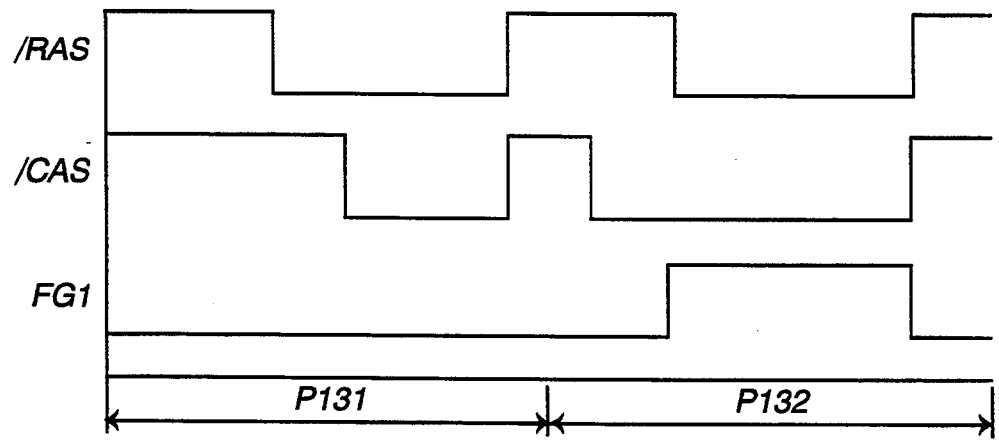
FIG. 23 is a signal waveform diagram of the DRAM with the temperature detecting circuit according to the present invention.

FIGS. 20 to 22 are circuit diagrams for implementing the CBR refresh operation according to a second embodiment of the present invention. FIG. 23 is a signal waveform diagram for implementing the CBR refresh operation.

There are illustrated a CBR detector 121, frequency dividers (counters) 122, a group 123 of the CBR counters, P channel type MOS transistor Qp, N channel type MOS transistor Qn, power supply voltage VCC and ground voltage VSS. Periods are designated as P131–P132 and signals as THD1, THD2, /RG0, /RAS, /CAS, FGn, /FGn, /FGB, An, /An.

To initiate the CBR refresh operation, the signal/CAS lowers to logic level "L" and the signal /RAS to logic level "L." The CBR detector 121 receives the external control signal /RAS and the signal /CAS as input and supplies the signals FG1, /FG1 as output. When the CBR detector 121 of FIG. 20 performs the CBR refresh operation, the signal FG1 takes logic level "H."

The signal /FG1 takes logic level "L." These signals FG1 and /FG1 are fed to the first stage divider (counter) 122 and are ½ divided in frequency. This divider 122 outputs the signals FG2, /FG2. The signals FG3, /FG3 are derived in a similar manner.

In response to the temperature detection signals THD1, THD2 from the above discussed temperature detection circuit, one of the signals FG1, /FG1, FG2, /FG2, FG3 and /FG3 is selected as the reference signal /FGB for the CBR refresh operation. This selection is made by a switch circuit 96 a circuit diagram of which is illustrated in FIG. 22.

Since the signal FG1 is at logic level "H" during the CBR refresh operation, node N151 in FIG. 20 assumes logic level "H." Node N151 provides as refresh signal the signal /RG0 which is in phase with the signal /FGB with four-stage delay time.

The resulting refresh signal is fed to the dividers 122 in the CBR counter group 123, generating internal address signals An, /An (n=0, 1, 2, 3, 4). A circuit diagram of the divider 122 is depicted in FIG. 21.

If temperature is below 40° C., then the CBR refresh interval is determined by the signal /RG0 which comprises as reference the signals FG3, /FG3 which are ¼ divided from the signals FG1, /FG1. Refresh, therefore, takes place every fourth CBR refresh operation.

If temperature is between 40° C. and 60° C., then the CBR refresh interval is determined by the signal /RG0 which consists as reference of the signals FG2, /FG2 which are ½ divided from the signals FG1, /FG1. Refresh, therefore, takes place every other CBR refresh operation.

Eventually, if temperature is above 60° C., then the CBR refresh interval is determined by the signal /RG0 which comprises the signals FG1, /FG1. Refresh takes place every CBR refresh operation.

In this manner, the CBR refresh operation is performed within the three temperature zones with boundaries of 40° C. and 60° C. in response to the temperature detection signals THD1, THD2. Accordingly, the DRAM with the CBR refresh function having a variable frequency of refresh may be implemented.

Should refresh take place once out of a plurality of times during the CBR refresh operation, power demand would be reduced, because the power consumption of DRAMs is proportional to the number of refresh. As the number of refresh decreases in accordance with the values of the data hold time of the DRAM, power consumption decreases correspondingly.

The period P131 in FIG. 23 indicates the normal mode operation where the signal /RAS lowers to logic level "L" and then the signal /CAS lowers to logic level "L." The period P132 indicates the CBR refresh mode operation where the signal /CAS lowers to logic level "L" and then the signal /RAS lowers to logic level "L."

Like the DRAM with the self-refresh function, the DRAM with the CBR refresh function has a feature that at low temperature the CBR refresh operation has an interval or intervals where no CBR refresh is performed. Power consumption may be reduced to the extent of the CBR refresh function skipped as compared with the conventional DRAMs. This saves the life of batteries.

Figure 24:
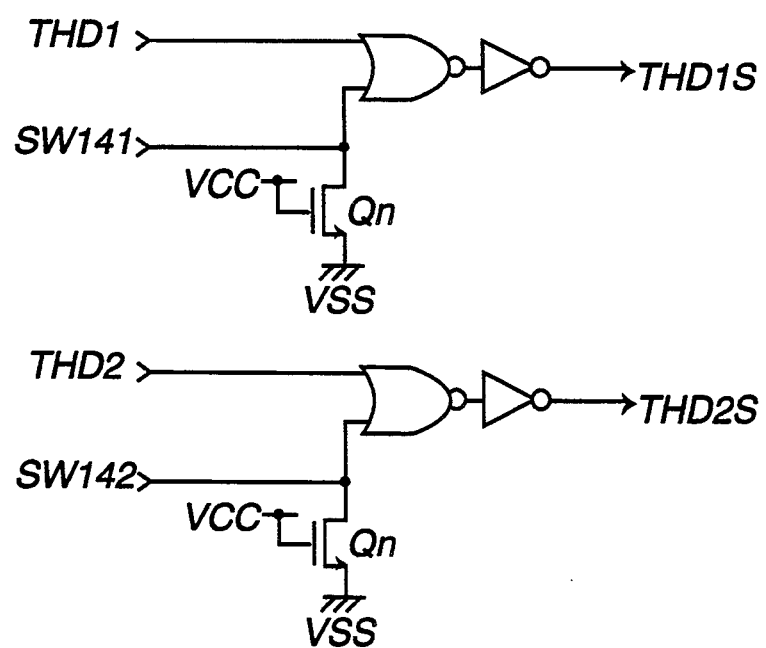
FIG. 24 is a circuit diagram of a third embodiment of a DRAM according to the present invention.

Referring to FIG. 24, there is illustrated a self-refresh or CBR-refresh DRAM having a circuit for selecting the need of control functions responsive to the temperature detection signals, according to a third embodiment of the present invention. A circuit diagram of the selection circuit for the need of the temperature detection signal-responsive control functions is illustrated in FIG. 24.

In the illustrated circuit, a logic sum of the temperature detection signal THD1 and a control signal SW141 is produced as signal THD1S, the control signal SW141 being connected to ground voltage VSS via N channel type MOS transistor Qn with the base thereof being supplied with the power supply voltage VCC. Similarly, a logic sum of the temperature detection signal THD2 and a control signal SW142 is produced as signal THD2S. The control signal SW142 is connected to ground voltage VSS via N channel type MOS transistor Qn with the base thereof being supplied with the power supply voltage VCC.

In this manner, the signals THD1S, THD2S are generated from the temperature detection signals THD1, THD2 and the signals SW141, SW142. The signals THD1, THD2 in the circuit diagrams showing the self-refresh or CBR-refresh DRAMs are replaced with these new signals THD1S, THD2S.

The signals SW141, SW142 are usually at logic level "L" so that the signals THD1S, THD2S assume the same logic level as do the signals THD1, THD2, respectively. If the signals SW141, SW142 rise to logic level "H," then the signals THD1S, THD2S become fixed at logic level "H."

The illustrated DRAM may be switched readily to the conventional type of DRAM, that is, one having no temperature detection signal-responsive control function, under control of the signals SW141, SW142.

Furthermore, provided that SW141 in FIG. 24 is kept at logic level "H" and SW142 at logic level "L," the DRAM control mode may be switched from the three-temperature zone control to two-temperature zone control.

Figure 25:
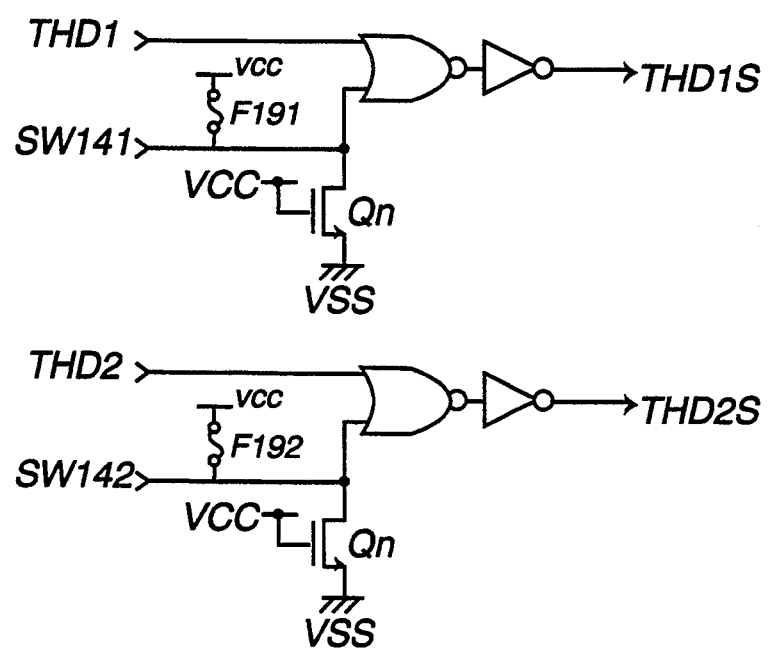
FIG. 25 is a circuit diagram of a fourth embodiment of a DRAM according to the present invention.

Referring to FIG. 25, there is illustrated a self-refresh or CBR-refresh DRAM having a circuit for selecting the need of control functions responsive to the temperature detection signals, according to a fourth embodiment of the present invention.

This circuit is similar to the embodiment of FIG. 24 except for a fuse F191 connected between the signal SW141 and the power supply voltage VCC and another fuse F192 between the signal SW142 and the power supply voltage VCC. With such arrangement, control of the signals SW141, SW142 is achieved by whether to break the fuses.

Figure 26:
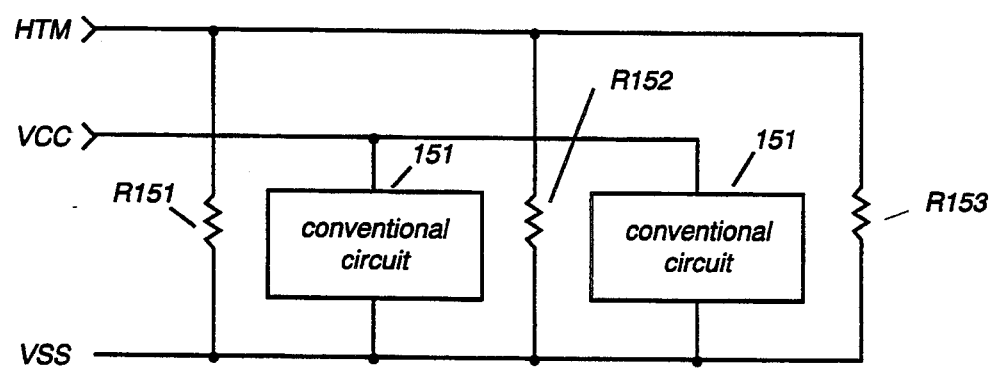
FIG. 26 is a circuit diagram of a DRAM with the device temperature enhancing function according to the present invention.

An embodiment of a DRAM with the function of enhancing the temperature of the semiconductor device will be described with reference to FIG. 26. FIG. 26 illustrates a conventional DRAM with addition of a circuit for enhancing the temperature of the semiconductor device. The circuit for enhancing the temperature of the semiconductor device comprises resistors inserted between conventional circuits 151, with both ends thereof connected between ground voltage VSS and signal HTM. The temperature of the DRAM increases in response to current flows between the ground voltage VSS and the signal HTM.

Although in this embodiment the circuit is made of the resistors, it is obvious that the temperature of the semiconductor device may be increased by merely using a higher power supply voltage for the conventional circuit at the cost of increased power consumption.

Where this function is utilized in inspecting semiconductor devices, the semiconductor devices may be inspected at high temperature without the need of a conventional temperature control attached to an inspection machine, such as prober hot chuck or the like. The temperature may also be controlled individually for respective semiconductor devices. At this time it takes a shorter time to increase or decrease the temperature, because the area of the respective semiconductor elements is much smaller than that of a wafer. For example, where the prober hot chuck is maintained as a whole at high temperature, it takes much time to lower the temperature. More particularly, where the semiconductor devices have the control function responsive to the temperature detection signals as discussed fully previously, it is possible to complete inspection at multiple temperature conditions and for a shorter period of time.

Figure 27:
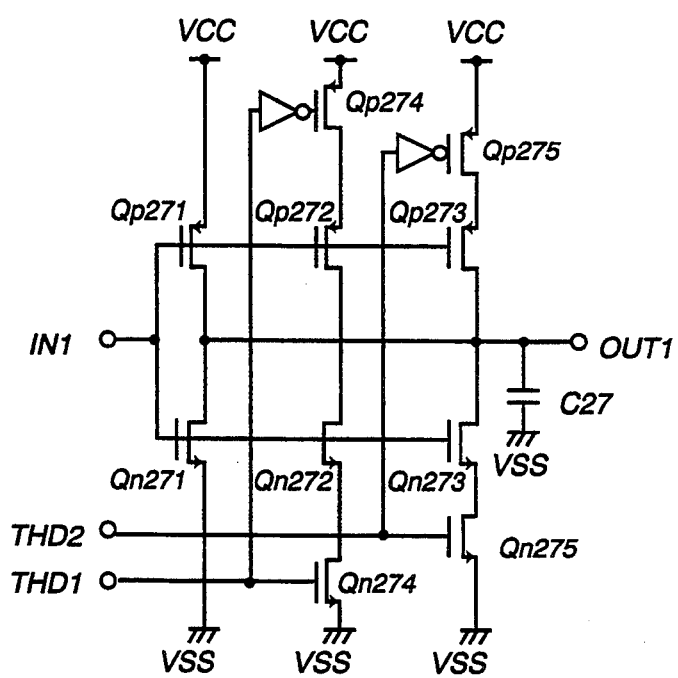
FIG. 27 is a circuit diagram of another DRAM with the device temperature enhancing function according to the present invention.
Figure 28:
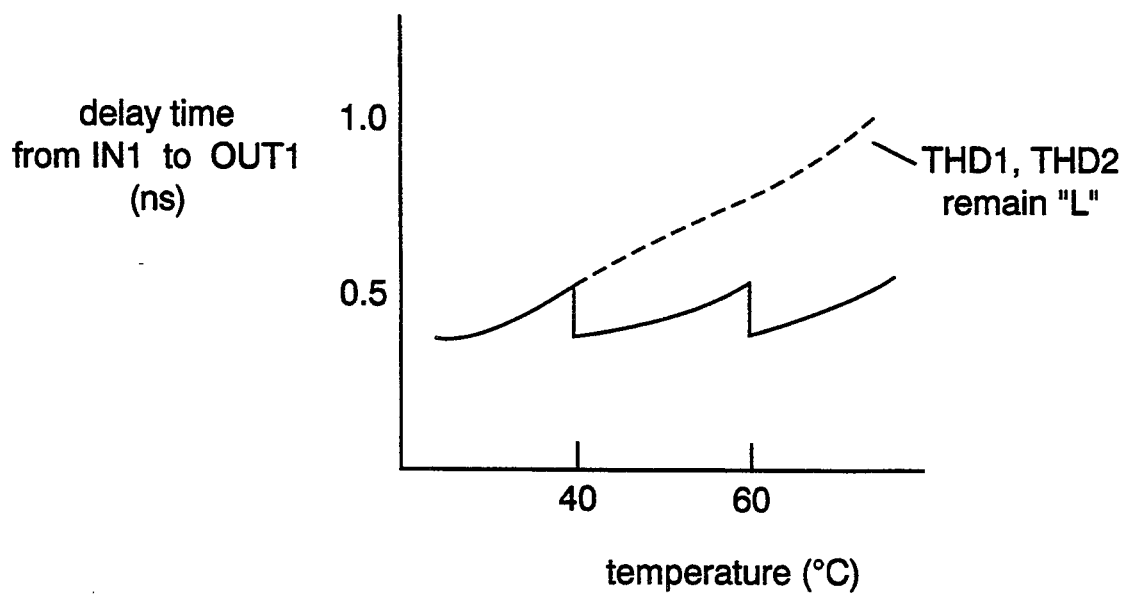
FIG. 28 is a graph showing the relationship between temperature and delay time from an input signal to an output signal.

Referring to FIGS. 27 and 28, there is illustrated a delay circuit to which the temperature detection circuit implementing the present invention is applied.

The circuit of FIG. 27 provides an inverse signals of input signal IN1 as output signal OUT1. The input signal IN1 is fed to all of the gates of N channel type MOS transistors Qn271, Qn272, Qn273 and P channel type MOS transistors Qp271, Qp272, Qp273. Further, all of the drains of the N channel type MOS transistors Qn271, Qn272, Qn273 and P channel type MOS transistors Qp271, QP272, Qp273 are connected to provide the output signal OUT1. Capacitor C27 is connected between the output signal OUT1 and the ground voltage VSS. The source of the N channel type MOS transistor Qn271 is connected to the power supply voltage VCC and the source of the P channel type MOS transistor Qp271 is connected to the ground voltage VSS. Disposed between the source of the N channel type MOS transistor Qn272 and the ground voltage VSS is an N channel type MOS transistor Qn274 having its gate receiving the temperature detection signal THD1. There is further disposed between the source of the P channel type MOS transistor Qp272 and the power supply voltage VCC a P channel type MOS transistor Qp274 having its gate receiving an inverse of the temperature detection signal THD1. An N channel type MOS transistor Qn275 having its gate receiving the temperature detection signal THD2 is connected between the source of the N channel type MOS transistor Qn273 and the ground voltage VSS. A P channel type MOS transistor Qp275 having its gate receiving an inverse of the temperature detection signal THD2 is connected between the source of the P channel type MOS transistor Qp273 and the power supply voltage VCC.

This circuit operates as follows: When temperature is below 40° C. THD1 and THD2 are both at logic level "L." With temperature between 40° C. and 60° C, THD1 is at logic level "H" and THD2 is at logic level "L." With temperature above 60° C., THD1 and THD2 are both at logic level "H." When THD 1 and THD2 are at logic level "H," the driving power of the NOT circuit as shown in FIG. 27 becomes improved as compared with that when both are at logic level "C," thus shortening the delay time from the input signal IN1 to the output signal OUT1. This relation in terms of the delay time from the input signal IN1 to the output signal OUT1 is illustrated in FIG. 28. The temperature dependency of the delay time from the input signal IN1 to the output signal OUT1 is smaller as compared with the conventional case where the temperature detection circuit is disabled (for example, THD1 and THD2 are both at logic level "L").

Figure 29:
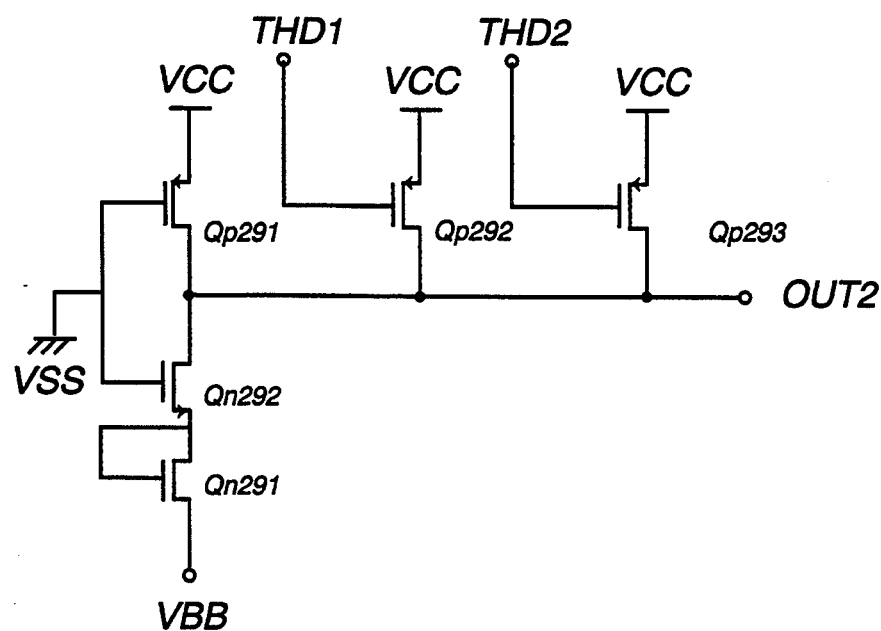
FIG. 29 is a circuit diagram of a substrate voltage detector circuit utilizing the temperature detecting circuit according to the present invention.
Figure 30:
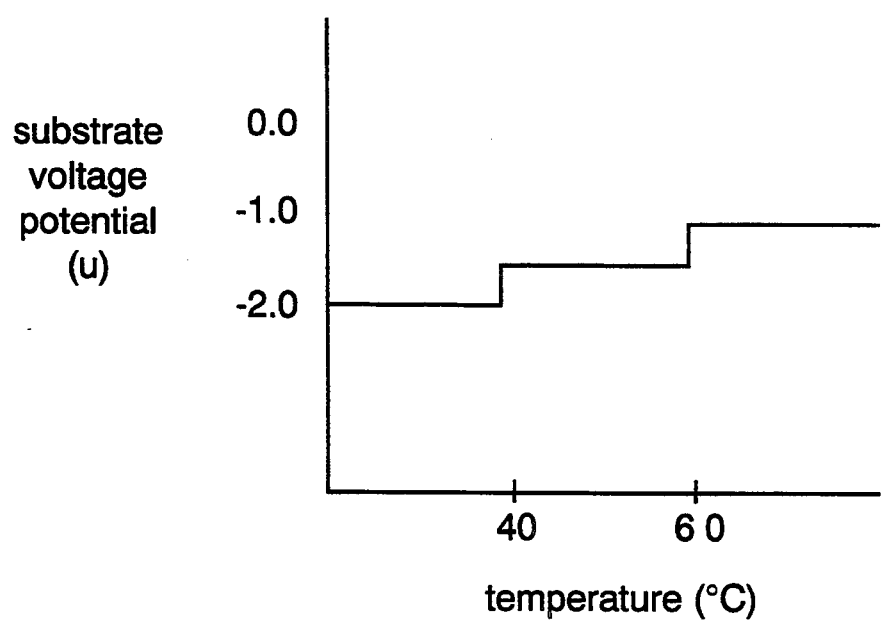
FIG. 30 is a graph showing the relationship between temperature and substrate voltage detection potential.
Figure 31:
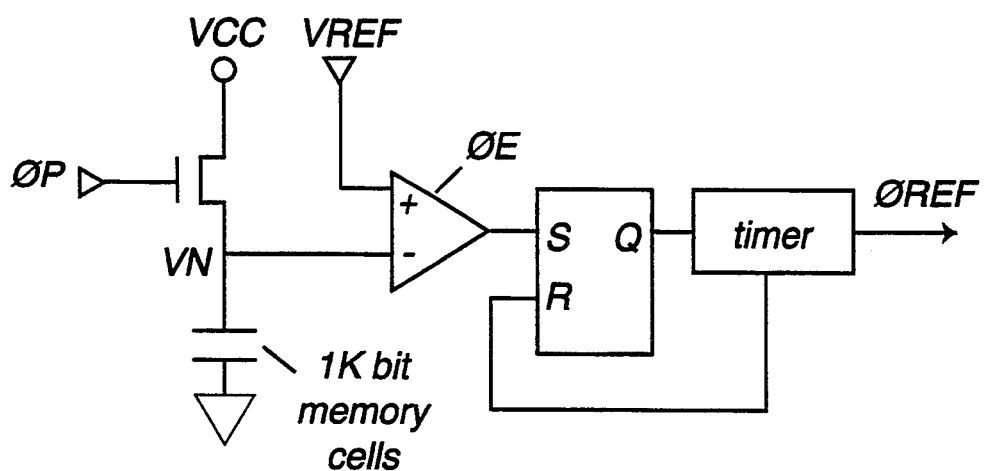
FIG. 31 is a circuit diagram of a conventional DRAM with self-refresh function.
Figure 32:
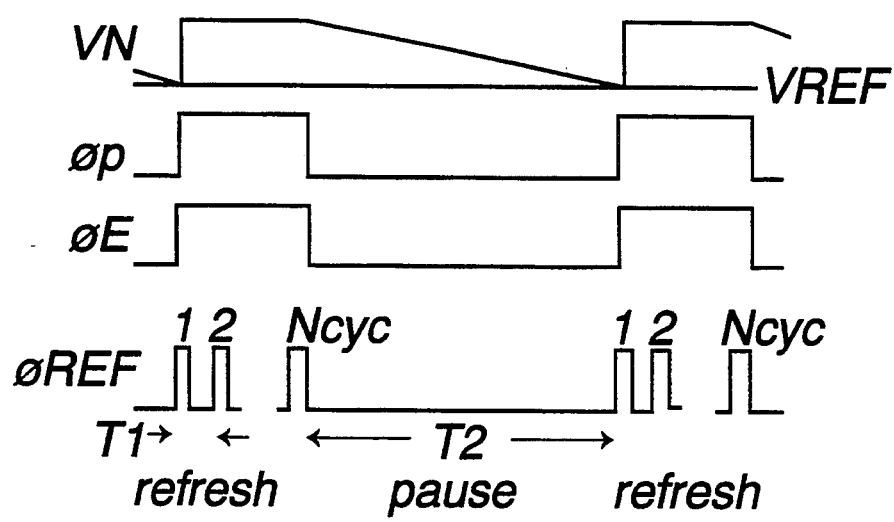
FIG. 32 is a signal waveform diagram of the conventional DRAM with self-refresh function as shown in FIG. 31.
Figure 33:
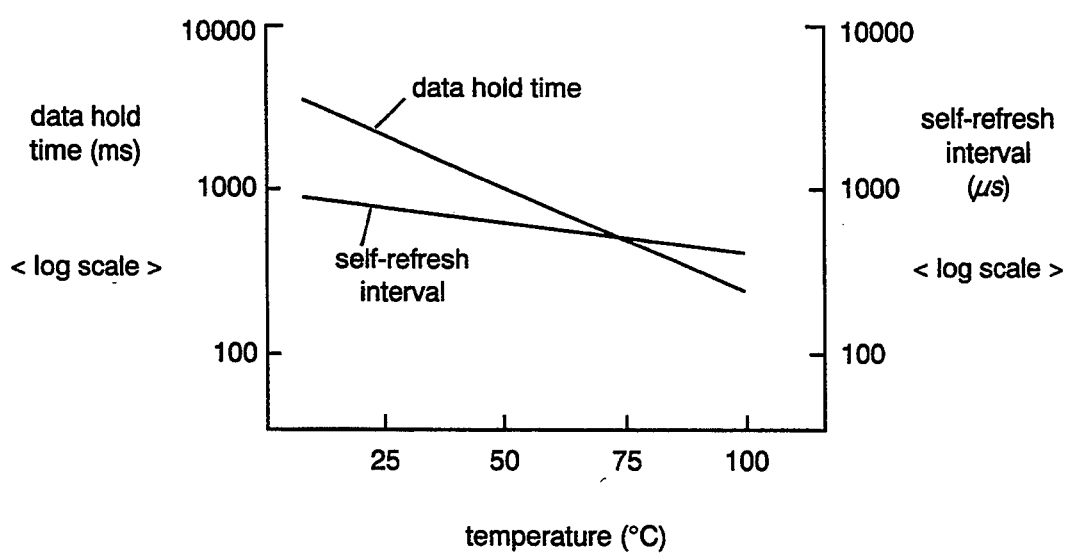
FIG. 33 is a graph showing the relationship between temperature and data hold time in the conventional DRAM with self-refresh function.

Referring to FIGS. 29 and 30, there is illustrated a substrate voltage detection circuit to which the temperature detection circuit implementing the present invention is applied. FIG. 29 shows a circuit for detecting the voltage level of substrate voltage VBB, which provides output signal OUT2 of logic level "L," with the substrate voltage VBB lower than a detection potential, and output signal OUT2 of logic level "H," with the substrate voltage VBB higher than the detection potential. There are connected between the output signal OUT2 and the power supply voltage VCC P channel type MOS transistors Qp291, Qp292, Qp293, with the gate of the P channel type MOS transistor Qp291 connected to the ground voltage VSS, the gate of the P channel type MOS transistor Qp292 connected to the temperature detection signal THD1, and the gate of the P channel type MOS transistor Qp293 connected to the temperature detection signal THD2. The output signal OUT2 is connected to the drain of an N channel type MOS transistor Qn292 of which the gate is connected to the ground voltage VSS. The source of the N channel type MOS transistor Qn292 is connected to the drain and gate of an N channel type MOS transistor Qn291 of which the source is connected to the substrate voltage VBB.

The above mentioned circuit operates as follows: With temperature below 40° C., THD1 and THD2 are both at logic level "L." At this time, both of the N channel type MOS transistors Qn292, Qn293 are on. To this end, the substrate voltage detection potential is $-2.0$ V.

When temperature is between 40° C. and 60° C., THD1 is at logic level "H" and THD2 is at logic level "L." At this time the N channel type MOS transistor Qn292 is off and the N channel type MOS transistor Qn293 is on. To this end, the substrate voltage detection potential is $-1.6$ V.

When temperature is higher than 60° C., THD1 and THD2 are both at logic level "H." At this time both of the N channel type MOS transistors Qn292, Qn293 are off. To this end, the substrate voltage detection potential is $-1.2$ V.

As is obvious from FIG. 30 showing the relationship between temperature and the substrate voltage detection potential, the substrate voltage detection potential increases at high temperature. The DRAM is enabled at high temperature to shorten pause time by bringing up the substrate voltage detection potential at high temperature.

As discussed in the foregoing description, the DRAM with the temperature detection circuit embodying the present invention is remarkably advantageous in that the refresh interval of the self-refresh operation at low temperature may be expanded to be a multiple integer longer than the reference interval and assure the self-refresh operation at the optimum refresh interval within a wide range of temperature, by the temperature detection circuit having no or less manufacturing deviations. Devices with substantially low power consumption at low temperature, therefore, may be supplied.

I claim:

1. A temperature detecting circuit comprising, an input terminal for supplying an input signal; a first delay circuit connected to the input terminal and including a plurality of NOT circuits for delaying the input signal and a first output terminal for providing the delayed input signal as a first output signal, the first delay circuit having a temperature-dependent delay time; a second delay circuit connected to the input terminal and in parallel with the first delay circuit and including a plurality of NOT circuits for delaying the input signal and a second output terminal for providing the delayed input signal as a second output signal, the second delay circuit having a temperature-dependent delay time, the temperature dependency of the delay time of the first delay circuit being larger than that of the second delay circuit, and means connected to the first and second output terminals for generating a temperature detection signal, depending upon the order of appearance of changes in the first and second output signals with change in temperature.

2. A temperature detection circuit according to claim 1 wherein said first and second delay circuits each comprises a P channel type MOS transistor or an N channel type MOS transistor and the source or drain of each of the transistors in the first and second delay circuits has a resistor, the resistor in the first delay circuit having a larger temperature dependency of its resistance than that of the resistor in the second delay circuit.

3. A temperature detection circuit according to claim 2 further comprising a circuit for making the resistance variable.

4. A temperature detecting circuit comprising, an input terminal for supplying an input signal; a first delay circuit connected to the input terminal and including a plurality of NOT circuits for delaying the input signal and a first output terminal for providing the delayed input signal as a first output signal, the first delay circuit having a temperature-dependent delay time; a second delay circuit connected to the input terminal and in parallel with the first delay circuit and including a plurality of NOT circuits for delaying the input signal and a second output terminal for providing the delayed input signal as a second output signal, the second delay circuit having a temperature-dependent delay time, the temperature dependency of the delay time of the first delay circuit being larger than that of the second delay circuit, and means connected to the first and second output terminals for generating a temperature detection signal, depending upon the order of appearance of changes in the first and second output signals with change in temperature, and wherein a capacitor load is connected to an output node of the NOT circuits in the first delay circuit via a resistor having a largely temperature-dependent resistance.

5. A temperature detection circuit according to claim 4 further comprising a circuit for making the resistance and the value of the capacitor load variable.

6. A temperature detecting circuit comprising a power supply voltage terminal, a reference potential terminal, first and second resistors connected in series between the power supply voltage terminal and the reference potential terminal, and third and fourth resistors connected in series between the power supply voltage terminal and the reference potential terminal, the first and fourth resistors being made of same material and the second and third resistors being made of same material, at least one of the first through fourth resistors having a resistance whose temperature dependency is larger than that of the remaining resistors, wherein a potential difference is detected between the junction of the first and second resistors and the junction of the third and fourth resistors, and the larger temperature dependency of the resistance of said at least one of the first through fourth resistors develops a change in the potential difference with change in temperature.

7. A temperature detecting circuit according to claim 6 wherein the first and second resistors are connected in series between the power supply voltage terminal and the reference potential terminal via a switching transistor, said third and fourth resistors are connected in series between the power supply voltage terminal and the reference potential terminal via a switching transistor.

8. A temperature detection circuit according to claim 6 wherein the resistances of the second and third resistors exhibit a larger temperature dependency and the resistances of the first and fourth resistors exhibit a smaller temperature dependency.

9. A temperature detection circuit according to claim 8 wherein the second and third resistors comprise N-Well resistors and the first and fourth resistors comprise polysilicon resistors.

10. A temperature detecting circuit comprising a power supply voltage terminal, a reference potential terminal, first and second resistors connected in series between the power supply voltage terminal and the reference potential terminal, and third and fourth resistors connected in series between the power supply voltage terminal and the reference potential terminal, the first and third resistors being made of same material and the second and fourth resistors being made of same material, at least one of the first through fourth resistors having a resistance whose temperature dependency is larger than that of the remaining resistors, wherein a potential difference is detected between the junction of the first and second resistors and the junction of the third and fourth resistors, and the larger temperature dependency of the resistance of said at least one of the first through fourth resistors develops a change in the potential difference with change in temperature.

11. A temperature detecting circuit according to claim 9 wherein the first and second resistors are connected in series between the power supply voltage terminal and the reference potential terminal via a switching transistor, the third and fourth resistors are connected in series between the power supply voltage terminal and the reference potential terminal via a switching transistor.

12. A temperature detection circuit according to claim 11 wherein the resistance of the second resistor exhibits a larger temperature dependency and the resistance of the fourth resistor exhibits a smaller temperature dependency.

13. A temperature detection circuit according to claim 12 further comprising a circuit for making variable the resistances of the second and fourth resistors.

14. A dynamic random access memory device comprising a temperature detecting circuit and a self-refresh circuit, the temperature detecting circuit comprising a power supply voltage terminal, a reference potential terminal, first, second, third and fourth resistors connected in series between the power supply voltage terminal and the reference potential terminal, the first and third resistors being made of same material and the second and fourth resistors being made of different materials, at least one of the first through fourth resistors having a resistance whose temperature dependency is larger than that of the remaining resistors, wherein a potential difference is detected between the junction of the first and second resistors and the junction of the third and fourth resistors, and the larger temperature dependency of the resistance of said at least one of the first through fourth resistors develops a change in the potential difference with change in temperature to generate a temperature detection signal, and wherein said self-refresh function circuit has the function of extending a refresh interval of the self-refresh function at low temperature, in response to the temperature detecting signal from the temperature detecting circuit.

15. A dynamic random access memory device comprising a temperature detecting circuit and a CBR refresh function circuit, the temperature detecting circuit comprising a power supply voltage terminal, a reference potential terminal, first, second, third and fourth resistors connected in series between the power supply voltage terminal and the reference potential terminal, the first and third resistors being made of same material and the second and fourth resistors being made of different materials, at least one of the first through fourth resistors having a resistance show temperature dependency is larger than that of the remaining resistors, wherein a potential is detected as a temperature detecting signal between the junction of the first and second resistors and the junction of the third and fourth resistors, and the larger temperature dependency of the resistance of said at least one of the first through fourth resistors develops a change in the potential difference with change in temperature to generate a temperature detection signal, and wherein the CBR refresh function of the CBR refresh function circuit at low temperature has an interval where no refresh is carried out, in response to the temperature detecting signal from the temperature detecting circuit.

16. A temperature detecting circuit comprising, an input terminal for supplying an input signal; a first delay circuit connected to the input terminal for delaying the input signal and a first output terminal for providing the delayed input signal as a first output signal, the first delay circuit having a temperature-dependent delay time; a second delay circuit connected to the input terminal and in parallel with the first delay circuit for delaying the input signal and a second output terminal for providing the delayed input signal as a second output signal, the second delay circuit having a temperature-dependent delay time, the temperature dependency of the delay time of the first delay circuit being larger than that of the second delay circuit, and means connected to the first and second output terminals for generating a temperature detection signal, depending upon the order of appearance of changes in the first and second output signals with change in temperature.

17. A dynamic random access memory device comprising a number of memory cells, a refresh circuit for refreshing the memory cells at an interval and a temperature detecting circuit, the temperature detecting circuit comprising, an input terminal for supplying an input signal; a first delay circuit connected to the input terminal for delaying the input signal and a first output terminal for providing the delayed input signal as a first output signal, the first delay circuit having a temperature-dependent delay time; a second delay circuit connected to the input terminal and in parallel with the first delay circuit for delaying the input signal and a second output terminal for providing the delayed input signal as a second output signal, the second delay circuit having a temperature-dependent delay time, the temperature dependency of the delay time of the first delay circuit being larger than that of the second delay circuit; and means connected to the first and second output terminals for generating a temperature detection signal, depending upon the order of appearance of changes in the first and second output signals with change in temperature; and a refresh interval modification circuit for modifying the interval of the refreshing of the memory cells in response to the temperature detection signal from the temperature detecting circuit, in a manner not to exceed data hold time of the memory cells regardless of temperature change.

* * * * *